United States Patent [19]

Muragishi

[11] Patent Number: 5,548,153

[45] Date of Patent: Aug. 20, 1996

[54] THIN FILM TRANSISTOR WITH MEANS TO PREVENT THRESHOLD VARIATIONS

[75] Inventor: Takeo Muragishi, Hyogo, Japan

[73] Assignee: Mitsubhisi Denki Kabushiki Kaisha, Tokyo, Japan

[21] Appl. No.: 563,778

[22] Filed: Nov. 27, 1995

Related U.S. Application Data

[63] Continuation of Ser. No. 278,090, Jul. 20, 1994, abandoned.

[30] Foreign Application Priority Data

Dec. 22, 1993 [JP] Japan ..................................... 5-324664

[51] Int. Cl.$^6$ .......................... H01L 29/76; H01L 31/036
[52] U.S. Cl. .............................. 257/365; 257/66; 257/75; 257/270; 257/331; 257/366; 257/402
[58] Field of Search ............................... 257/66, 75, 270, 257/331, 365, 366, 402

[56] References Cited

U.S. PATENT DOCUMENTS

| 4,319,263 | 3/1982 | Rao ......................................... 257/366 |
| 4,636,824 | 1/1987 | Ikoma et al. ............................. 257/365 |
| 5,338,959 | 8/1994 | Kim et al. ................................ 257/365 |

FOREIGN PATENT DOCUMENTS

| 63-124470 | 5/1988 | Japan . |
| 3-161966 | 7/1991 | Japan . |
| 4-125970 | 4/1992 | Japan . |
| 4-137556 | 5/1992 | Japan . |
| 5-110093 | 4/1993 | Japan . |

OTHER PUBLICATIONS

"Negative Bias Temperature Instability in Poly–Si TFTs", S. Maeda et al., 1993 Symposium on VLSI Technology 3B–3, pp. 29–30.

"Thin Film Effects of Double–Gate Polysilicon MOSFET", T. Hashimoto et al., Extended Abstract of the 22nd Conference, pp. 393–396.

"A Half–Micron SRAM Cell Using a Double–Gated Self–Aligned Polysilicon PMOS Thin Film Transistor (TFT) Load", 1990 Symposium on VLSI Technology, pp. 19–20.

Primary Examiner—Mahshid Saadat
Attorney, Agent, or Firm—Lowe, Price, Leblanc & Becker

[57] ABSTRACT

Upward and downward variation of a threshold voltage of a TFT is effectively suppressed by a semiconductor device and a method of manufacturing the same. In the semiconductor device, a conductive layer is formed on the substantially same plane as a semiconductor layer forming a channel region and source/drain regions of the TFT, and is spaced from the semiconductor layer by a predetermined distance. A predetermined potential is applied to the conductive layer. Thereby, an electric field is applied from the conductive layer to the channel region of the TFT, so that variation of the threshold voltage of the TFT is effectively prevented.

19 Claims, 23 Drawing Sheets

THIN FILM TRANSISTOR WITH MEANS TO PREVENT THRESHOLD VARIATIONS

This application is a continuation of application Ser. No. 08/278,090 filed Jul. 20, 1994, now abandoned.

BACKGROUND OF THE INVENTION

1. Field of the Invention

The present invention relates to a semiconductor device and a method of manufacturing the same, and in particular to a semiconductor device having a thin film transistor and a method of manufacturing the same.

2. Description of the Background Art

As is known, TFTs (Thin Film Transistors) are a kind of semiconductor elements, and have been used in SRAMs and others. It is important for the SRAM that a power consumption is low and data can be held with a low voltage of 1.5 V or less. The TFTs have been employed for these purposes. FIG. 33 is a schematic cross section showing a conventional TFT. In the conventional TFT shown in FIG. 33, a polysilicon film 301 is provided at its predetermined regions with source/drain regions 301b, which are spaced from each other by a predetermined distance and are located at opposite sides of a channel region 301. A gate electrode 300 is formed on the channel region 301a with a gate oxide film 302 therebetween. The TFT is of a P-type if the TFT used in the SRAM has the above structure.

FIG. 34 is a graph showing I-V characteristics of a P-type TFT. Referring to FIG. 34, a current at a point A is a current of the TFT at the off state, and corresponds to a standby current of the SRAM. A current at a point B is a drain current of the TFT at the on state, and corresponds to a drain current of the SRAM while data is held thereby. The smaller the current at the point A is and the larger the current at the point B is, the higher performance the SRAM achieves. In the conventional TFT, however, the threshold voltage is liable to vary. If the threshold voltage of the TFT varies by −0.5 V, the current value lowers by one order of magnitude as shown in FIG. 34. As described above, there is a disadvantage that data cannot be held if the current of the turned-on TFT lowers.

A phenomenon in which the threshold voltage of TFT varies will be described below in detail. FIG. 35 is an equivalent circuit diagram showing a flip-flop circuit of the SRAM. FIG. 35 is an equivalent circuit diagram showing a flip-flop circuit of the SRAM. FIG. 36 is a graph showing variation of the I-V characteristics of the TFT under an H-state stress (indicated by (1)) and an L-state stress (indicated by (2)). Referring to FIGS. 35 and 36, the threshold voltage of the TFT varies upwardly, i.e., in an increasing direction, under the H-state stress (-BT stress). Thereby, the ON-current decreases, resulting in a disadvantage that the SRAM cannot hold data. The phenomenon in which the threshold voltage increases under the H-state stress is considered to be caused by the fact that, as shown in FIG. 37, Si—H of the TFT at a channel polysilicon side reacts on Si—O at a gate $SiO_2$ side to produce OH which escapes, so that an interface level and fixed electric charges generate. This is specifically disclosed in 1993 *Symposium on VLSI Technology* 3B-3, pp 29–30.

Under the L-state stress, the threshold voltage of the TFT varies downwardly, i.e., in a decreasing direction, as shown in FIG. 36. As a result, the TFT changes into a depletion type. Therefore, the standby current of the SRAM increases, resulting in increase of a current consumption. It is considered that this phenomenon in which the threshold voltage decreases under the L-state stress is caused by electron trap due to electron injection near the drain region. The variation of the threshold voltage under the H-state stress is larger than that under the L-state stress.

As described above, the semiconductor device having the conventional TFTs suffers from various problems resulting from disadvantageous variation of the threshold voltage of the TFT.

SUMMARY OF THE INVENTION

Accordingly, it is an object of the invention to provide a semiconductor device having a thin film transistor and capable of preventing variation of a threshold voltage of the thin film transistor.

Another object of the invention is to provide a semiconductor device having a thin film transistor and capable of effectively preventing increase of a threshold voltage of the thin film transistor.

Still another object of the invention is to provide a method of manufacturing a semiconductor device having a thin film transistor which enables easy manufacturing of the semiconductor device capable of preventing variation of a threshold voltage of the thin film transistor.

A semiconductor device according to an aspect of the invention includes a semiconductor layer, a conductive layer and a gate electrode.

In this semiconductor device, the semiconductor layer forms source/drain regions and a channel region of a thin film transistor, and the conductive layer is formed substantially on the same plane as the semiconductor layer with a predetermined space therebetween. A predetermined potential is applied to the conductive layer. Therefore, variation of a threshold voltage of the thin film transistor is effectively prevented. The conductive layer may be formed at opposite sides of the semiconductor layer so that the semiconductor layer may be located between portions of the conductive layer. This facilitates application of an electric field from the conductive layer to the channel region, so that variation of the threshold voltage of the thin film transistor is prevented further effectively.

A semiconductor device of another aspect of the invention includes a semiconductor layer, a gate electrode and a conductive layer. The gate electrode is formed on one of surfaces of the semiconductor layer with a gate insulating layer therebetween.

In this semiconductor device, the semiconductor layer forms source/drain regions and a channel region of a thin film transistor. The conductive layer is formed on the other surface of the semiconductor layer with an insulating layer therebetween and is opposed only to the channel region. A predetermined potential is applied to the conductive layer. Therefore, an electric field is applied from the conductive layer to the channel region, so that variation of a threshold voltage of the thin film transistor is effectively prevented.

A semiconductor device according to still another aspect of the invention includes a semiconductor layer, a gate electrode and a conductive layer.

In this semiconductor device, the semiconductor layer forms source/drain regions and a channel region of a thin film transistor. The conductive layer is formed on the other surface of the semiconductor layer with an insulating film therebetween and overlaps partially with the semiconductor layer. A predetermined potential is applied to the semiconductor layer. Therefore, an electric field is applied to the semiconductor layer from a portion of the conductive layer overlapping with the semiconductor layer. Thereby, variation of a threshold voltage of the thin film transistor is prevented.

A semiconductor device according to yet another aspect of the invention includes a thin film transistor, an input line, an inverting circuit, a switching circuit, and a circuit for preventing variation of a threshold voltage. A first power supply is connected to one terminal of the thin film transistor.

This semiconductor device is provided with a switching circuit for performing switching in accordance with an output signal sent from the inverting circuit. The switching circuit includes terminals, one of which is connected to a second power supply and the other of which is connected to the circuit for preventing variation of the threshold voltage. Therefore, a predetermined potential is applied to the circuit for preventing variation of the threshold voltage in accordance with the signal on the input line. Thereby, when the threshold voltage of the thin film transistor varies upwardly, a low potential which suppresses the variation is applied to the conductive layer, when the threshold voltage varies downwardly, a high voltage which suppresses the variation is applied to the conductive layer. As a result, rising and lowering of the thin film transistor are effectively prevented.

A semiconductor device according to still another aspect of the invention includes a thin film transistor of a first conductivity type, an input line, a switching transistor of a second conductivity type, a second power supply and a circuit for preventing variation of a threshold voltage. A first power supply circuit is connected to one terminal of the thin film transistor.

The semiconductor device is provided with a switching transistor for performing switching in accordance with a signal on the input line. The switching transistor includes terminals, one of which is connected to the second power supply circuit and the other of which is connected to the circuit for preventing variation of the threshold voltage, so that a predetermined potential is applied to the circuit for preventing variation of the threshold voltage. Thereby, upward or downward variation of the threshold voltage of the thin film transistor is effectively prevented similarly to the semiconductor device of the above aspect of the invention.

A semiconductor device of a further aspect of the invention includes a thin film transistor and a circuit for preventing variation of a threshold voltage.

In this semiconductor device, there is provided the circuit for preventing variation of the threshold voltage of the thin film transistor which receives a potential in a range between a potential of a power supply and a ground potential. Therefore, increase of the threshold voltage of the thin film transistor is effectively prevented.

A method of manufacturing a semiconductor device according to an aspect of the invention includes the steps of forming a semiconductor layer which forms source/drain regions and a channel region of a thin film transistor, forming a gate electrode on one of surfaces of the semiconductor layer with a gate insulating layer therebetween, and forming a conductive layer for receiving a predetermined potential on the other surface of the semiconductor layer with an insulating layer therebetween, the conductive layer being opposed only to the channel region in the semiconductor layer.

According to this method of manufacturing the semiconductor device, since the conductive layer for receiving the predetermined potential is formed on the other surface of the semiconductor layer with the insulating layer therebetween and is opposed only to the channel region of the semiconductor layer, the semiconductor device capable of effectively preventing variation of a threshold voltage of the thin film transistor can be manufactured easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below.

Figure 1:
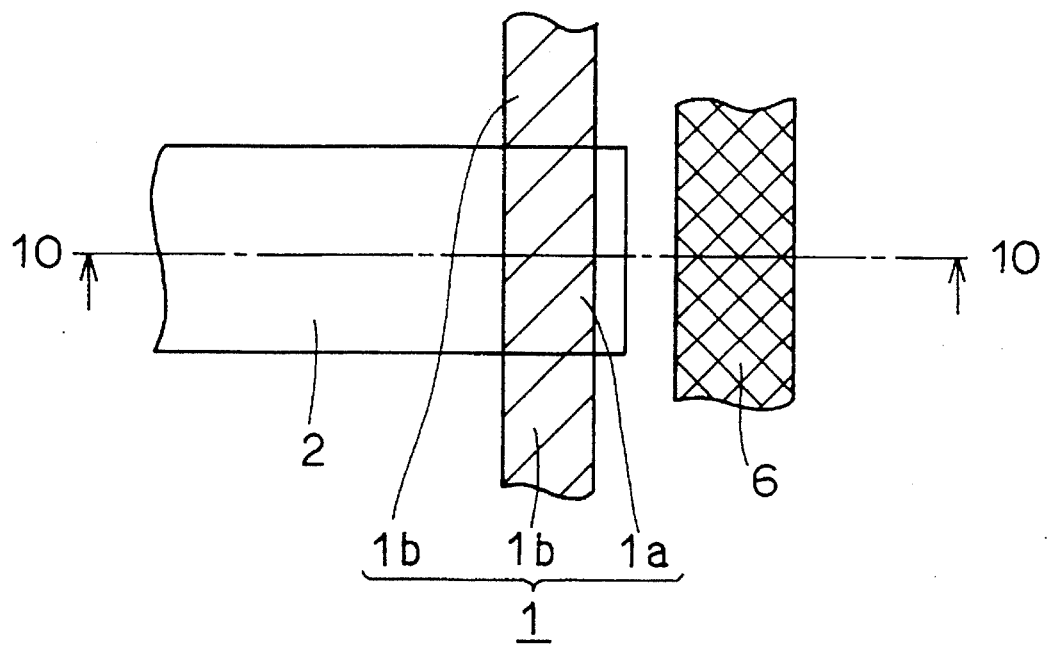
FIG. 1 is a plan showing a semiconductor device having a TFT according to a first embodiment of the invention.
Figure 2:
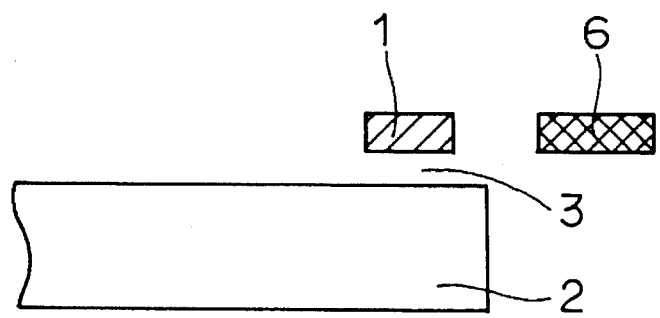
FIG. 2 is a cross section of the semiconductor device of the first embodiment taken along line 10—10 in FIG. 1.

Referring to FIGS. 1 and 2, a semiconductor device of a first embodiment is provided with a polysilicon film 1 which extends in a predetermined direction and forms a channel region 1a and source/drain regions 1b. A gate electrode 2 which extends substantially perpendicularly to an extending direction of the polysilicon film 1 is formed on a lower surface of the polysilicon film 1 with a gate oxide film 3 therebetween. A conductor layer 6 which extends substantially parallel to the polysilicon film 1 with a predetermined space therebetween is formed at the substantially same plane as the polysilicon film 1. Thereby, the electric field applied from the conductor layer 6 would reach up to the channel region 1a of the polysilicon film 1, so that upward and downward variation of the threshold voltage of the TFT can be effectively prevented.

Figure 3:
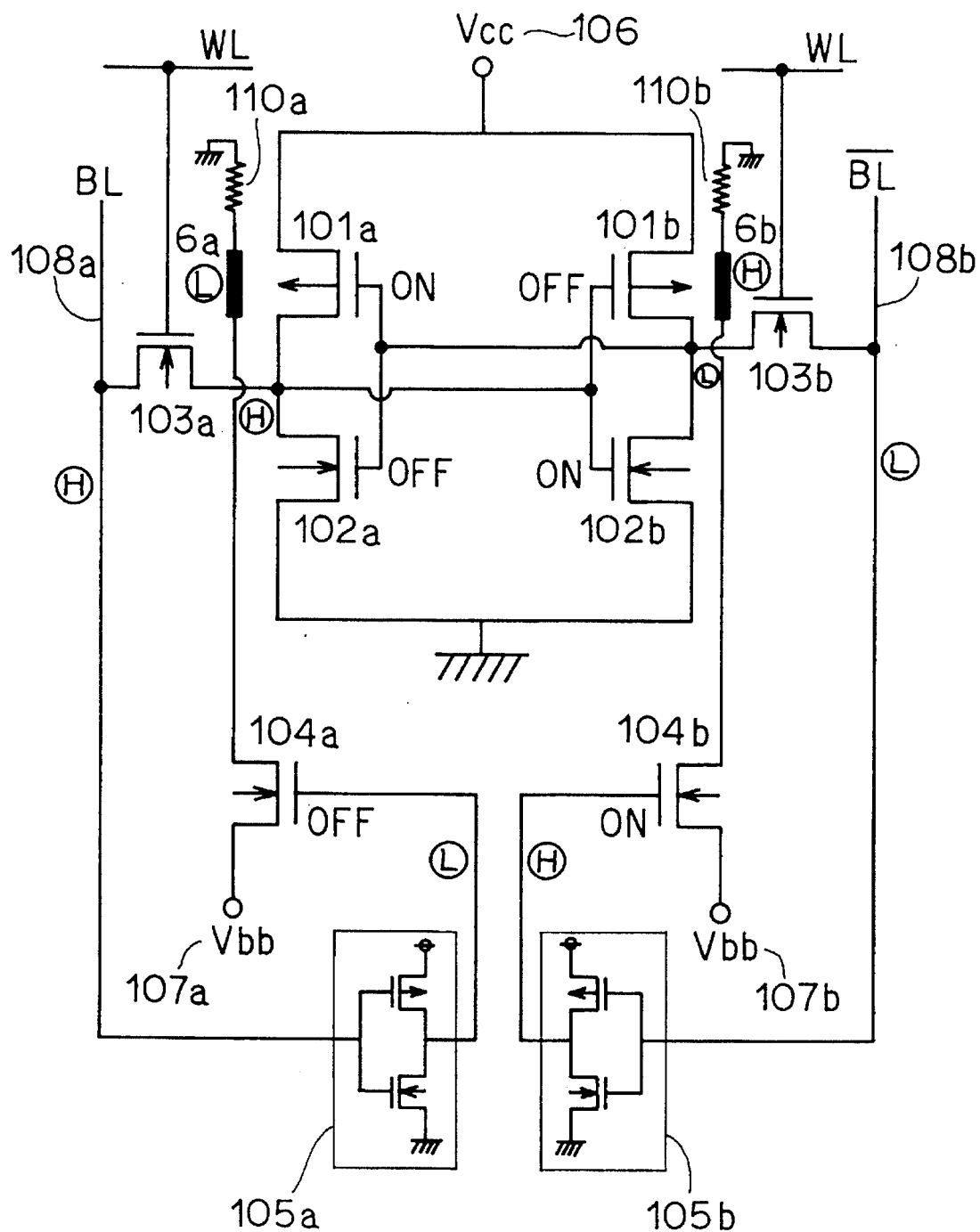
FIG. 3 is a circuit diagram showing a first specific example of a memory cell circuit of an SRAM including the semiconductor device of the first embodiment shown in FIGS. 1 and 2.

Referring to FIG. 3, a first specific example of a memory cell circuit of an SRAM includes a flip-flop formed of two CMOS inverters. One of the CMOS inverters is formed of a P-type TFT 101a functioning as a load transistor and an N-type transistor 102a functioning as a driver transistor. The other CMOS inverter is formed of a P-type TFT 101b functioning as a load transistor and an N-type transistor 102b functioning as a driver transistor. An N-type transistor 103a functioning as an access transistor is connected to a bit line 108a, and an N-type transistor 103a functioning as an access transistor is connected to a bit line 108b.

The bit line 108a is also connected to a sense amplifier 105a formed of a CMOS inverter. The bit line 108b is also connected to a sense amplifier 105b formed of a CMOS inverter. An N-type transistor 104a is connected to an output side of the sense amplifier 105a. An N-type transistor 104b is connected to an output side of the sense amplifier 105b. A power supply $V_{bb}$ 107a is connected to one of terminals of the N-type transistor 104a. A power supply $V_{bb}$ 107b is connected to one terminal of the N-type transistor 104b. The other terminal of the N-type transistor 104a is connected to a conductor layer 6a. The conductor layer 6a is connected to one end of a high resistance portion 110a, the other end of which is grounded.

The other terminal of the N-type transistor 104b is connected to a conductor layer 6b. The conductor layer 6b is also connected to one end of a high resistance portion 110b, the other end of which is grounded. One end of the TFT 101a and one end of the TFT 101b are connected to a power supply $V_{cc}$ 106, of which voltage is lower than those of the power supplies $V_{bb}$ 107a and 107b.

Referring to FIG. 3, an operation of the first specific example of a memory cell circuit of the SRAM will be described below. It is assumed that the bit line 108a is kept at an H-potential ($V_{cc}$ potential or $V_{bb}$ potential), and the bit line 108b is kept at an L-potential (ground potential). In this case, the P-type TFT 101a is at the ON state, and the P-type TFT 101b is at the OFF state. Further, the driver transistor (N-type transistor) 102a is at the OFF state, and the driver transistor (N-type transistor) 102b is at the ON state. In this case, the output of the sense amplifier 105a connected to the bit line 108a is at the L-potential, so that the N-type transistor 104a is at the OFF state. Therefore, the conductor layer 6a is at the L-potential. The output of the sense amplifier 105b connected to the bit line 108b is at the H-potential, so that the N-type transistor 104b is at the ON state. Thereby, the conductor layer 6b is at the H-potential.

Thus, when the TFT 101a is at the ON state, the potential of the conductor layer 6a is equal to the ground potential and is not higher than the source potential of the TFT 101a. Thereby, upward variation of the threshold voltage of the TFT 101a is suppressed. When the TFT 101b is at the OFF state, the potential of the conductor layer 6b is equal to the H-potential and is not higher than the source potential of the TFT 101b. Thereby, downward variation of the threshold voltage of the TFT 101b is suppressed.

In the first specific example of the memory cell circuit, as described above, the conductor layers (6a and 6b) are set to the L-potential if the TFTs (101a and 101b) are at the ON state, respectively, and the conductor layers (6a and 6b) are set to the H-potential if the TFTs (101a and 101b) are at the OFF state, respectively. Thereby, upward and downward variation of the threshold voltage of the TFTs (101a and 10b) can be suppressed effectively.

Figure 4:
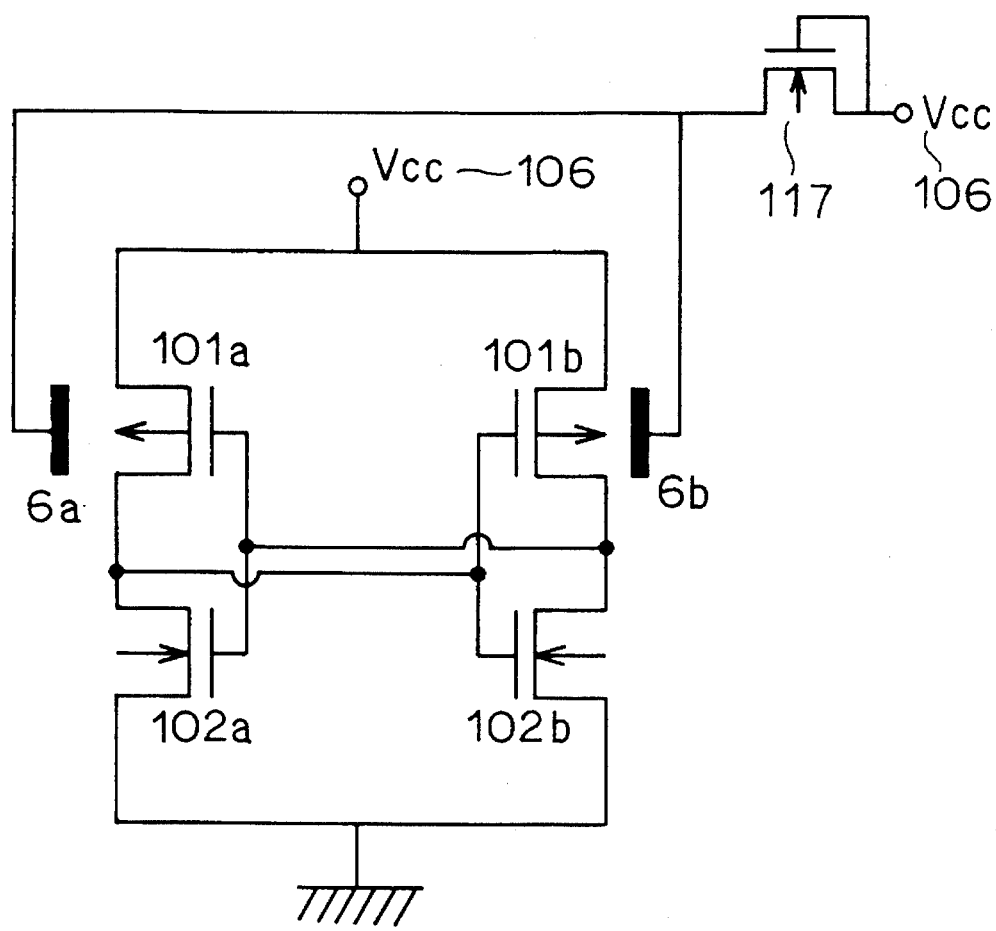
FIG. 4 is a circuit diagram showing a second specific example of a memory cell circuit of an SRAM including the semiconductor device of the first embodiment shown in FIGS. 1 and 2.
Figure 36:
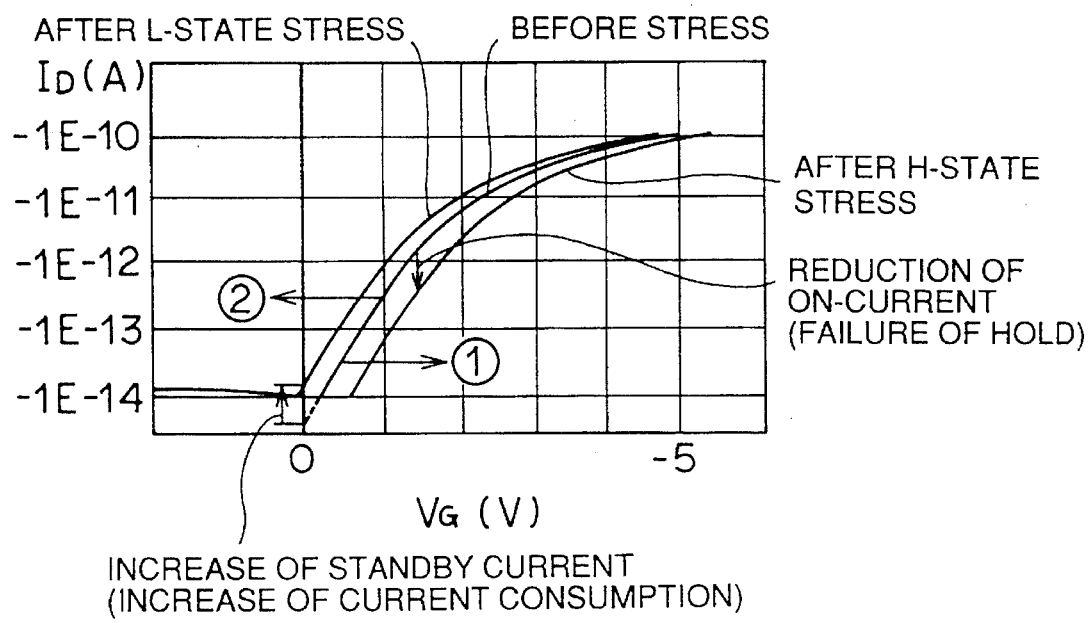
FIG. 36 is a graph showing I-V characteristics in the case where an H-state stress and an L-state stress are applied to the conventional SRAM.
Figure 37:
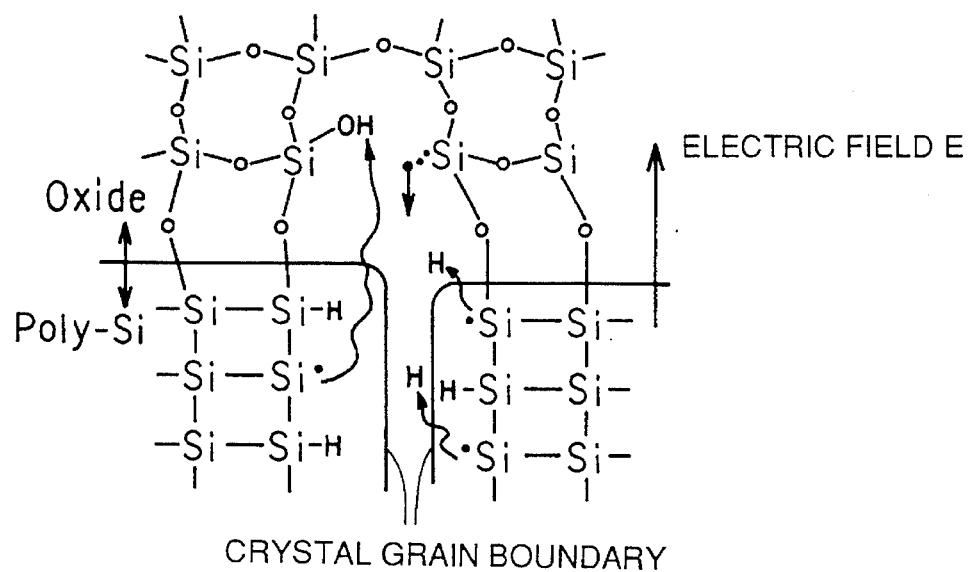
FIG. 37 is a schematic diagram showing a mechanism by which a threshold voltage is raised when an H-state stress is applied to the conventional TFT.

Referring to FIG. 4, a second specific example of a memory cell of the SRAM differs from the first specific example described before in that fixed potentials are applied to the conductor layers 6a and 6b. More specifically, the power supply $V_{cc}$ 106 and the conductor layers 6a and 6b are electrically connected together with an N-type transistor 117 interposed therebetween. Thereby, the conductor layers 6a and 6b maintain a potential which is intermediate the supply voltage $V_{cc}$ and the ground potential and consequently is always lower than the source potentials ($V_{cc}$ potentials) of the TFTs 101a and 101b. Thereby, it is possible to prevent effectively upward variation of threshold voltages of the TFTs when the TFTs 101a and 101b are at the ON state. In this second specific example, it is however impossible to prevent effectively downward variation of the threshold voltage of the TFTs 101a and 101b at the OFF state. However, as already stated in connection with the prior art, variation of the threshold voltages of the TFTs 101a and 101b at the OFF state is smaller than that of the threshold voltages thereof at the ON state (see FIG. 36), so that any serious problem does not occur even if reduction of the threshold voltages of the TFTs 101a and 101b cannot be prevented.

Figure 5:
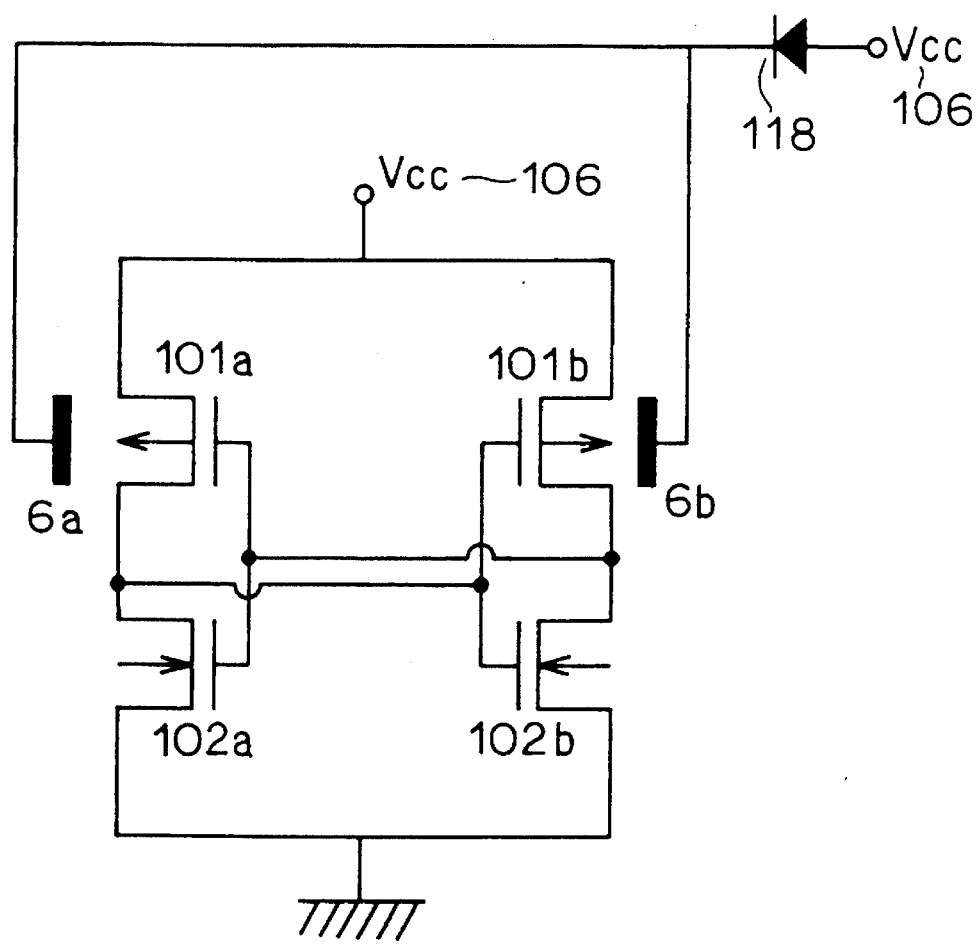
FIG. 5 is a circuit diagram showing a third specific example of a memory cell circuit of an SRAM including the semiconductor device of the first embodiment shown in FIGS. 1 and 2.

Referring to FIG. 5, a third specific example of a memory cell circuit of the SRAM differs from the second specific example in that the TFTs 6a and 6b and the power supply $V_{cc}$ 106 are connected together with a diode 118 is interposed therebetween. This structure can achieve an effect similar to that of the second specific example shown in FIG. 4.

Figure 6:
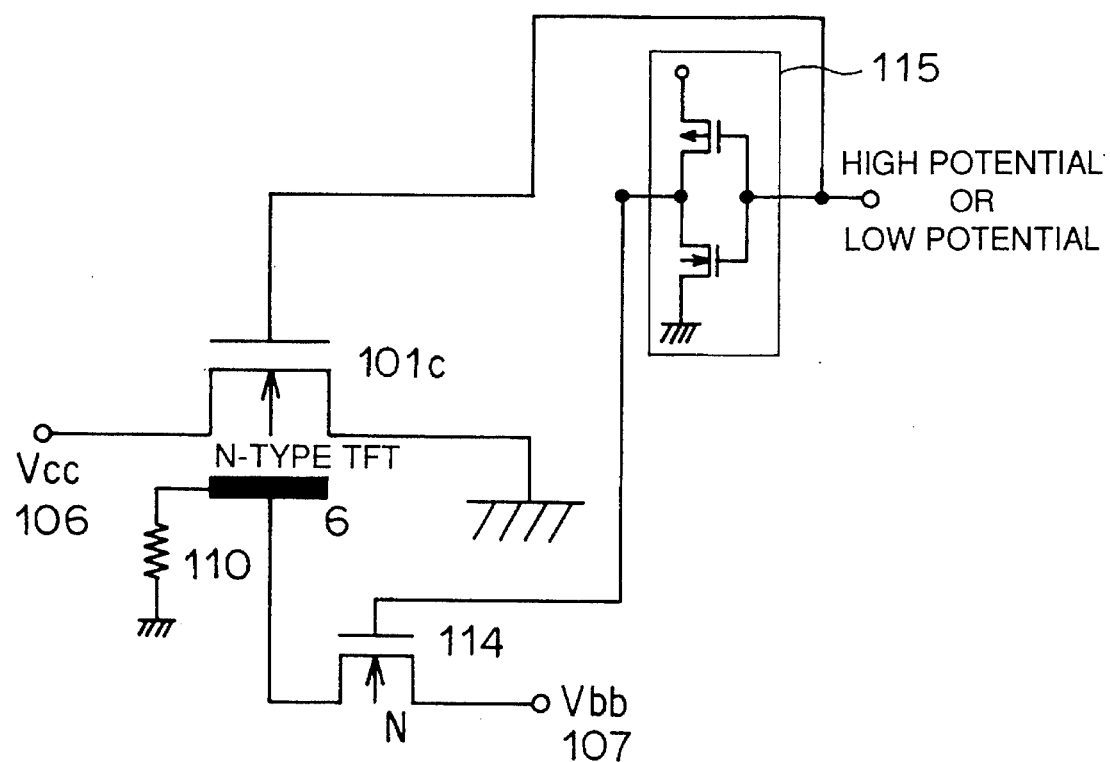
FIG. 6 is a circuit diagram showing a first specific example of a control circuit including only a TFT portion of the semiconductor device shown in FIGS. 1 and 2.

Referring to FIG. 6 showing a first specific example of a circuit including only a TFT portion, a gate electrode of an N-type TFT 101c is connected to an input terminal of a sense amplifier 115. An output terminal of the sense amplifier 115 is connected to a gate electrode of an N-type transistor 114. One terminal of the N-type transistor 114 is connected to a power supply $V_{bb}$ 107, and the other terminal is connected to the conductor layer 6. One end of a high resistance portion 110 is connected to the conductor layer 6, and the other end thereof is grounded. One terminal of the N-type transistor 101c is connected to a power supply $V_{cc}$ 106, and the other terminal is grounded.

In operation, when the H-potential is applied to the gate electrode of the N-type TFT 101c, the N-type TFT 101c is turned on. In this case, the sense amplifier 115 sends the output signal of L-potential, so that the transistor 114 is turned off. Therefore, the conductor layer 6 is held at the L-potential (ground potential) which is lower than the source potential of the TFT 101c.

When the L-potential is applied to the N-type TFT 101c, the N-type TFT 101c is turned off. In this case, the sense amplifier 115 sends the output signal of H-potential, so that the N-type transistor 114 is turned on. Thereby, the conductor layer 6 is held at the H-potential which is higher than the source potential of the N-type TFT 101c. According to the first specific example of the circuit including only the TFT portion, as described above, the conductor layer 6 is held at the H-potential higher than the source potential of the N-type TFT 101c when the N-type TFT 101c is at the OFF state, and the conductor layer 6 is held at the L-potential lower than the source potential of the N-type TFT 101c when the N-type TFT 101c is at the ON state. Thereby, it is possible to prevent effectively the upward or downward variation of the threshold voltage of the N-type TFT 101c.

Figure 7:
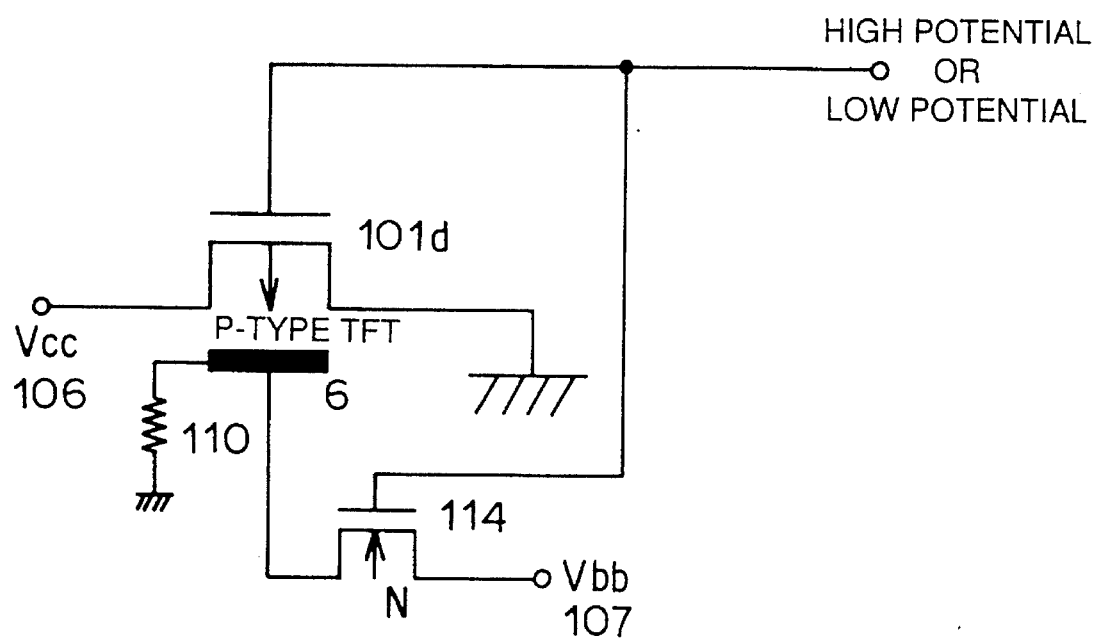
FIG. 7 is a circuit diagram showing a second specific example of a control circuit including only a TFT portion of the semiconductor device shown in FIGS. 1 and 2.

Referring to FIG. 7, a circuit of the second specific example including only a TFT portion has such a structure that a gate electrode of a P-type TFT 101d is directly connected to a gate electrode of the N-type transistor 114.

In operation, when the L-potential is applied to the gate electrode of the P-type TFT 101d, the P-type TFT 101d is turned on. In this case, the N-type transistor 114 also receives on its gate electrode the L-potential and thus is turned off. Thereby, the conductor layer 6 is held at the L-potential which is lower than the potential of the P-type TFT 101d. Therefore, it is possible to prevent effectively upward variation of the threshold voltage of the P-type TFT 101d. When the P-type TFT 101d receives on its gate electrode the H-potential, the P-type TFT 101d is turned off. In this case, the N-type transistor 114 also receives on its gate electrode the H-potential, so that the N-type transistor 114 is turned on. Thereby, the conductor layer 6 is held at the H-potential which is higher than the source potential of the P-type TFT 101d. Therefore, it is possible to prevent effectively downward variation of the threshold voltage of the P-type TFT 101d.

Figure 8:
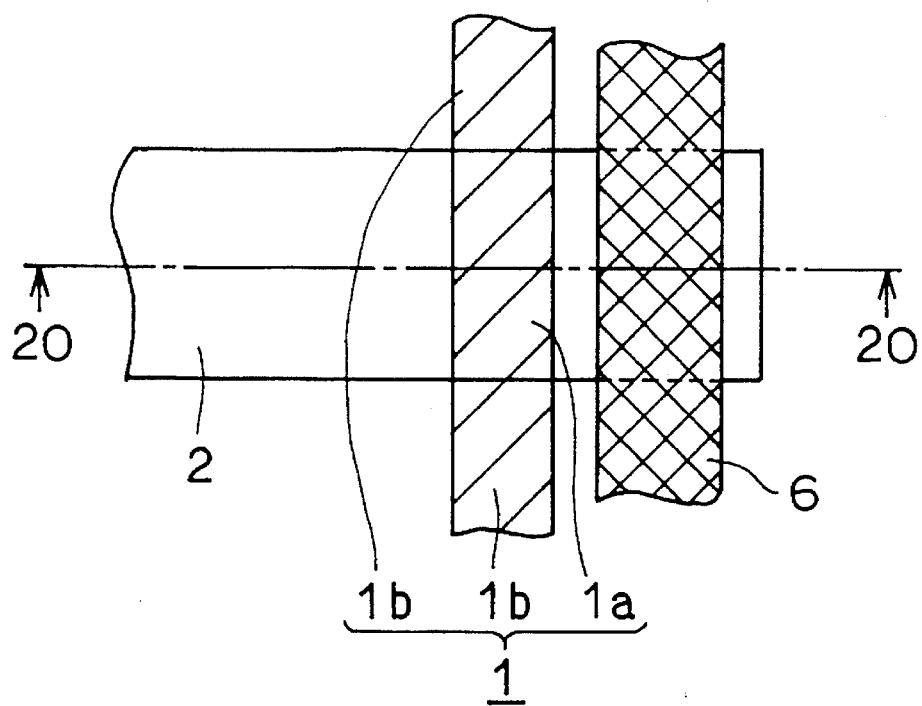
FIG. 8 is a plan showing a semiconductor device having a TFT according to a second embodiment of the invention.
Figure 9:
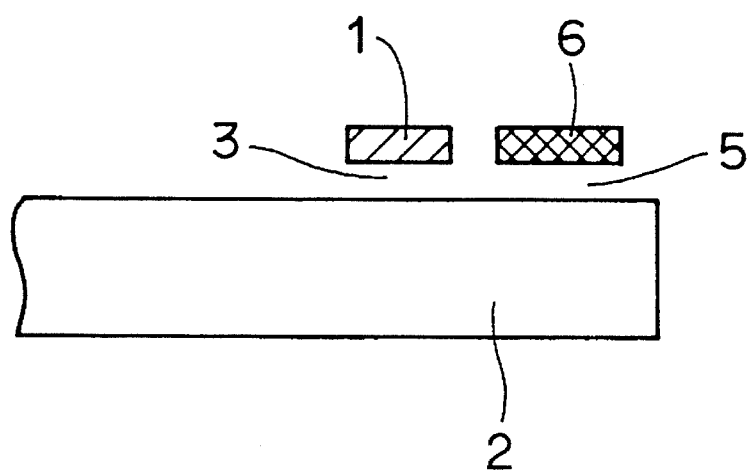
FIG. 9 is a cross section of the semiconductor device of the second embodiment taken along line 20—20 in FIG. 8.

Referring to FIGS. 8 and 9, a semiconductor device of a second embodiment differs from the first embodiment shown in FIGS. 1 and 2 in that the gate electrode 2 is extended up to a position under the conductor layer 6 with an insulating layer 5 therebetween. This structure achieves an effect similar to that of the semiconductor device of the first embodiment. More specifically, a variable or fixed potential is applied to the conductor layer 6, whereby an electric field is applied to the channel region 1a, so that it is possible to prevent effectively the upward or downward variation of the threshold voltage of the TFT.

Figure 10:
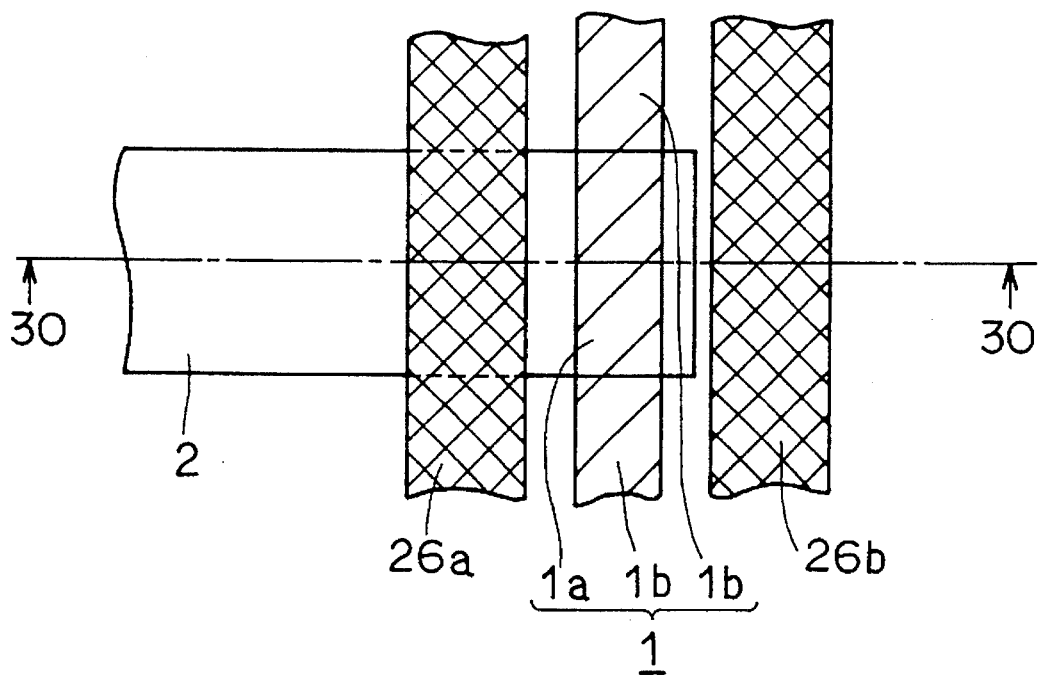
FIG. 10 is a plan showing a semiconductor device having a TFT according to a third embodiment of the invention.
Figure 11:
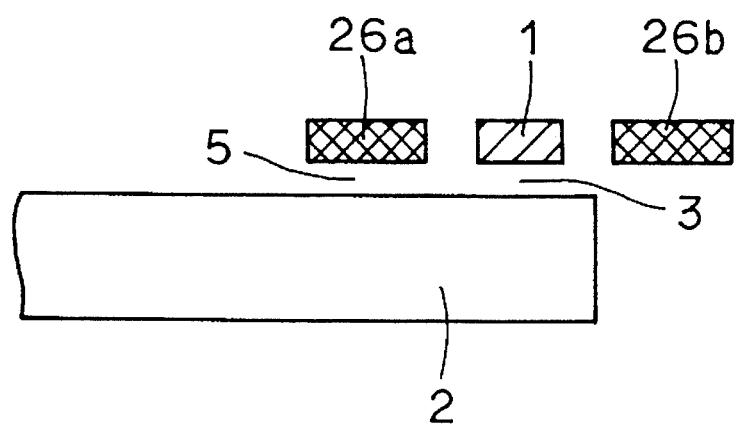
FIG. 11 is a cross section of the semiconductor device of the third embodiment taken along line 30—30 in FIG. 10.

Referring to FIGS. 10 and 11, a semiconductor device of a third embodiment has such a structure that conductor layers 26a and 26b are formed at opposite sides of the polysilicon film 1, which forms the channel region 1a and the source/drain regions 1b of the TFT, with predetermined spaces therebetween and are located at substantially the same plane as the polysilicon film 1. Owing to formation of the conductor layers 26a and 26b at the opposite sides of the polysilicon film 1, an electric field is applied from the opposite sides of the channel region 1a of the polysilicon film 1 when a predetermined potential is applied to the conductor layers 26a and 26b. Thereby, a higher electric field can be applied to the channel region 1a compared with the first embodiment shown in FIGS. 1 and 2 and the second embodiment shown in FIGS. 8 and 9. As a result, it is possible to prevent effectively upward or downward variation of the threshold voltage of the TFT.

Figure 12:
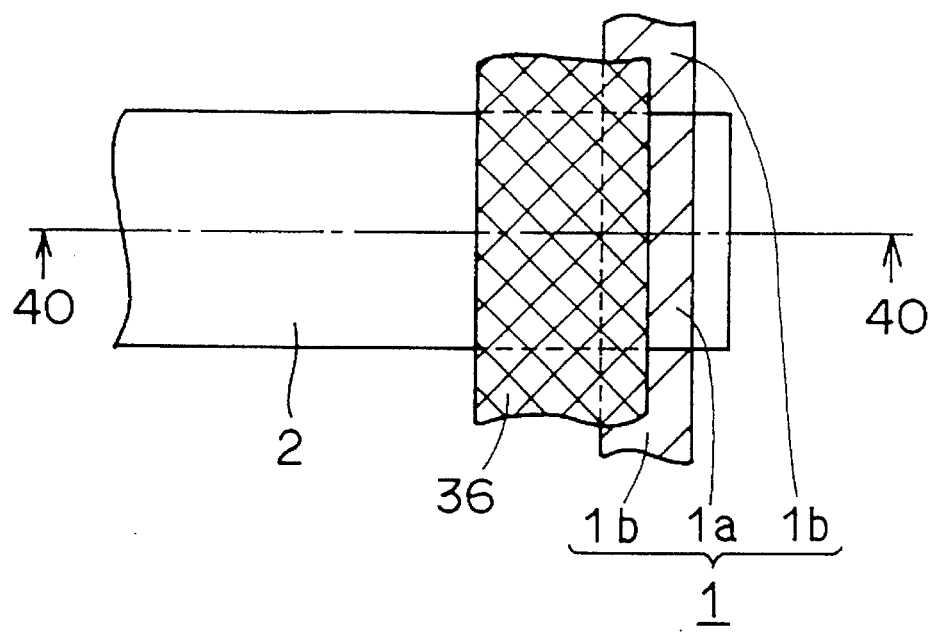
FIG. 12 is a plan showing a semiconductor device having a TFT according to a fourth embodiment of the invention.
Figure 13:
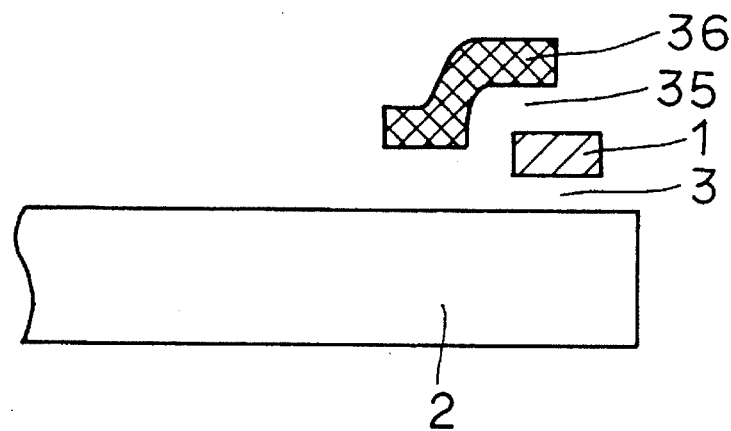
FIG. 13 is a cross section of the semiconductor device of the fourth embodiment taken along line 40—40 in FIG. 12.

Referring to FIGS. 12 and 13, a semiconductor device of a fourth embodiment is provided with a conductor layer 36 which partially overlaps with the polysilicon film 1 with an insulating layer 35 therebetween. This structure can achieve an effect similar to those of the semiconductor devices of the first to third embodiments. Thus, owing to application of the fixed or variable potential to the conductor layer 36, it is possible to effectively prevent upward or downward variation of the threshold voltage of the TFT.

Figure 14:
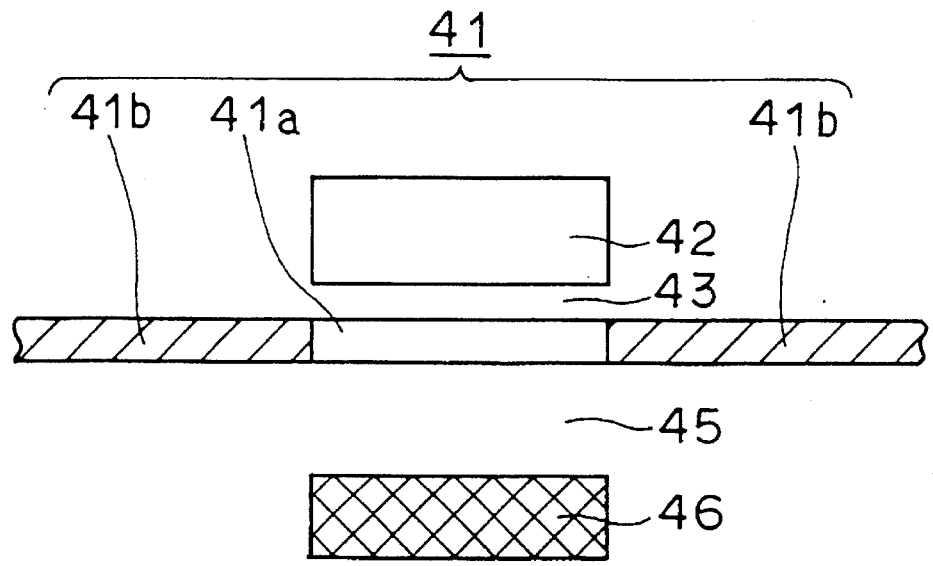
FIG. 14 is a cross section showing a semiconductor device having a TFT according to a fifth embodiment of the invention.

Referring to FIG. 14, a fifth embodiment is provided with a channel region 41a and source/drain regions 41b which extend on the same plane. A gate electrode 42 is formed on the upper surface of the channel region 41a with a gate insulating film 43 therebetween. A conductor layer 46 is formed on the lower surface of the channel region 41a with an insulating layer 45 therebetween. In this fifth embodiment, the conductor layer 46 is opposed only to the channel region 41a. This structure applies the electric field to the channel region 41a owing to application of the variable or fixed potential to the conductor layer 46. Thereby, downward or upward variation of the threshold voltage can be effectively prevented.

Figure 15:
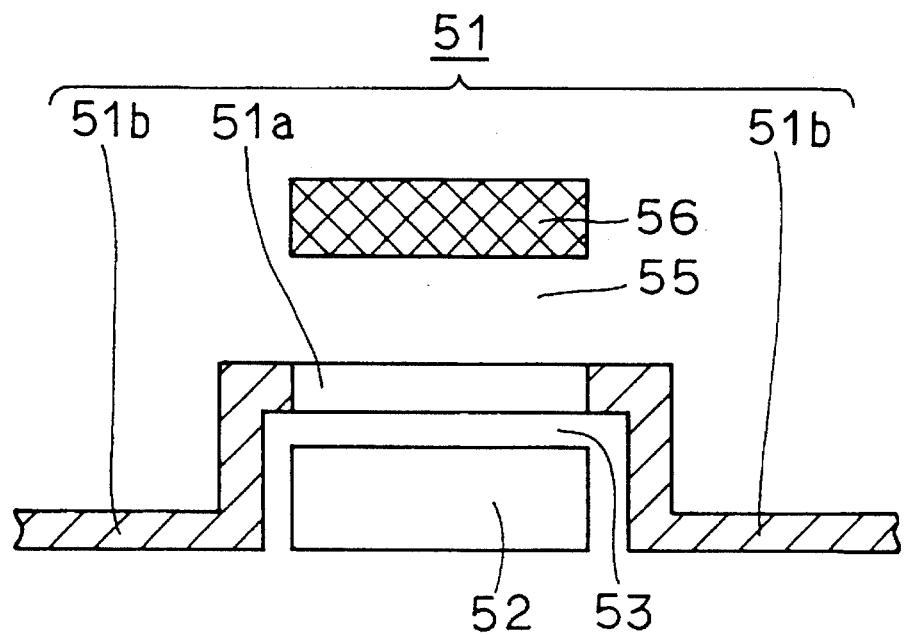
FIG. 15 is a cross section showing a semiconductor device having a TFT according to a sixth embodiment of the invention.

Referring to FIG. 15, a semiconductor device of a sixth embodiment is provided with a polysilicon film 51 formed on an upper and side surfaces of a gate electrode 52 with a gate insulating film 53 therebetween. The polysilicon film 51 forms a channel region 51a and source/drain regions 51b. A conductor layer 56 is formed on the upper surface of the channel region 51a with an insulating layer 55 therebetween. This conductor layer 56 is opposed only to the channel region 51a similarly to the fifth embodiment. This embodiment can effectively prevent upward or downward variation of the threshold voltage by applying variable or fixed potential to the conductor layer 56, similarly to the first to fifth embodiments.

Figure 16:
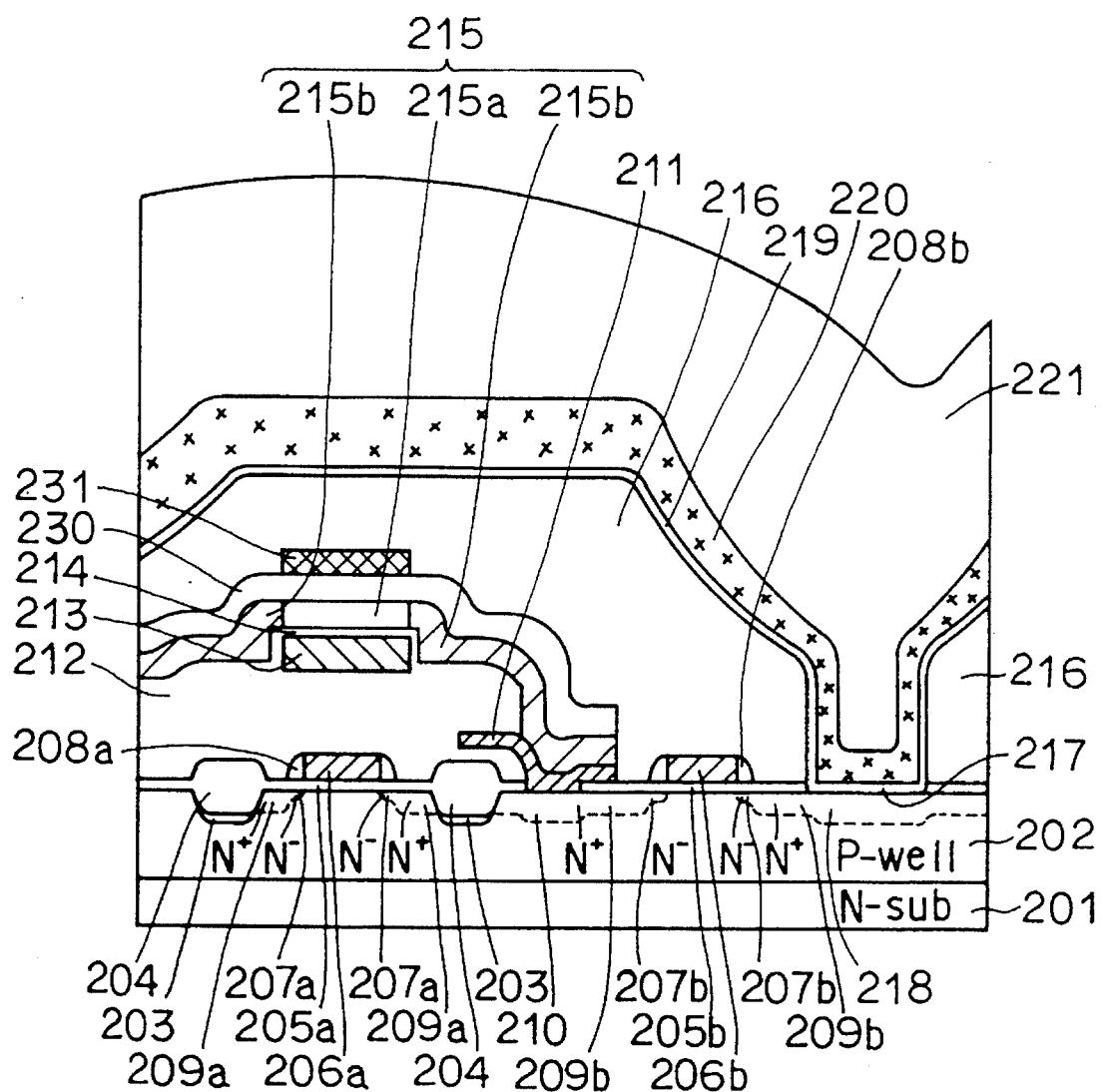
FIG. 16 is a cross section showing a semiconductor device having a TFT according to a seventh embodiment of the invention.

Referring to FIG. 16, an SRAM of a seventh embodiment is an example of application of the structure of the sixth embodiment shown in FIG. 15 to an SRAM. As shown in FIG. 16, the seventh embodiment is provided with a P-well 202 formed on an N-type semiconductor substrate 201. A P-type impurity region 203 and an element isolating oxide film 204 are formed at predetermined regions on the surface of the P-well 202. N-type high concentration impurity regions 209a and 209b are formed at a region surrounded by the element isolating oxide film 204 with a predetermined space between each other. N-type low concentration regions 207a and 207b are formed at sides of the high concentration impurity regions 209a and 209b near the channel region, respectively.

There are also formed N-type impurity regions 218 and 210 which are continuous to the high concentration impurity regions 209b. A gate electrode 206a is formed on the P-well 202, which is located between the low concentration impurity regions 207a, with a gate oxide film 205a therebetween. Side wall insulating films 208a are formed on opposite side surfaces of the gate electrode 206a. A gate electrode 206b is formed on the P-well 202, which is located between the low concentration impurity regions 207b, with a gate oxide film 205b therebetween. Side wall insulating films 208b are formed on opposite side surfaces of the gate electrode 206a.

The gate electrode 206a and element isolating oxide film 204 are covered with an interlayer insulating film 212. The N-type impurity region 210 is electrically connected to a contact electrode 211. An upper surface of the contact electrode 211 is electrically connected to a polysilicon film (including "amorphous silicon film") 215 which forms a channel region 215a and source/drain regions 215b of the TFT. A gate electrode 213 is formed on the lower surface of the channel region 215a with a gate oxide film 214 therebetween. An interlayer insulating film 230 is formed on the polysilicon film 215. A conductor layer 231 is formed at a region of the interlayer insulating film 230 located above the channel region 215a. The whole surface is covered with an interlayer insulating film 216, which is provided with a contact opening 217 located above an N-type impurity region 218. A barrier metal layer 219 has a portion which is located in the contact opening 217 and electrically connected to the N-type impurity region 218, and extends along the upper surface of the interlayer insulating film 216. An aluminum interconnection 220 is formed on the barrier metal layer 219, and is covered with a passivation film 221.

A method of manufacturing the semiconductor device of the seventh embodiment will be described below with reference to FIGS. 17 to 27.

Figure 17:
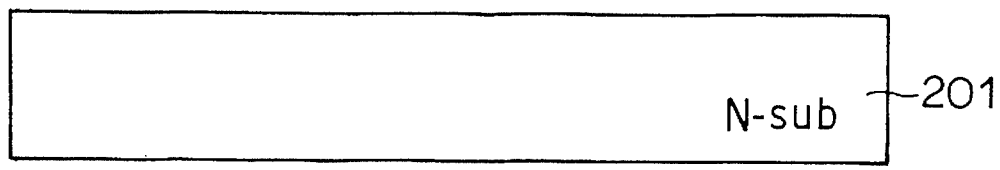
FIGS. 17–27 are cross sections showing 1st to 11th steps in a process of manufacturing the SRAM of the seventh embodiment shown in FIG. 16.
Figure 18:
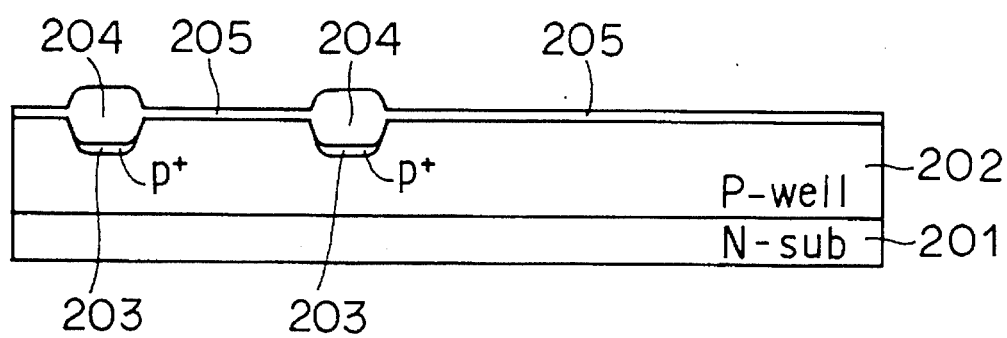

As shown in FIG. 17, the N-type semiconductor substrate 201 is first prepared. Then, as shown in FIG. 18, the P-well 202 is formed on the surface of the N-type semiconductor substrate 210. The P-type impurity region 203 and element isolating oxide film 204 are formed at predetermined regions on the surface of the P-well 202. A gate oxide film 205 is formed on the whole surface.

Figure 19:
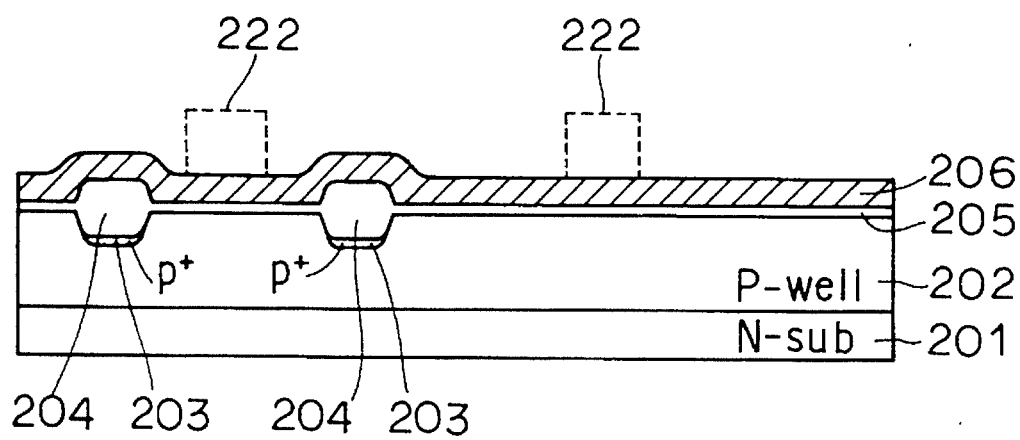
Figure 20:
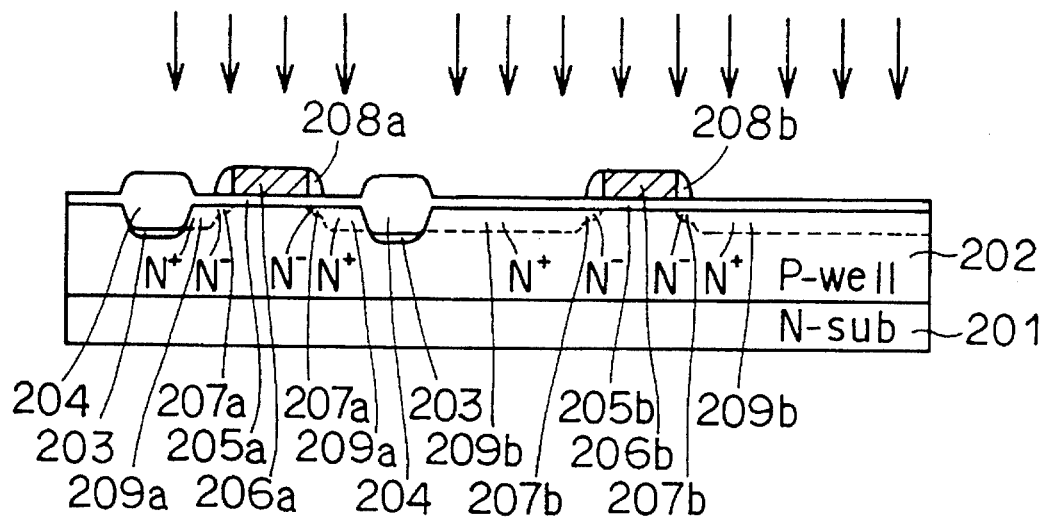

As shown in FIG. 19, the polysilicon film 206 containing N-type impurity doped thereinto is formed on the gate oxide film 205. A resists 222 is formed at predetermined regions on the polysilicon film 206. Using the resist 222 as a mask, anisotropic etching is effected on the polysilicon film 206 to form the gate electrodes 206a and 206b as shown in FIG. 20. Using the gate electrodes 206a and 206b or the resist 222 as a mask, ion implantation of N-type impurity is carried out to form the N-type low concentration impurity regions 207a and 207b.

The side wall insulating films 208a and 208b are formed on the opposite side walls of the gate electrodes 206a and the opposite side walls of the gate electrodes 206b, respectively. N-type impurity is ion-implanted into the P-well 202 using the gate electrodes 206a and 206b and the side wall insulating films 208a and 208b as a mask. Thereby, the N-type high concentration impurity regions 209a and 209b are formed. Through these steps, the N-type MOS transistor is completed. In this manner, access transistors, driver transistors and word lines are formed in memory cells of the SRAM.

Figure 21:
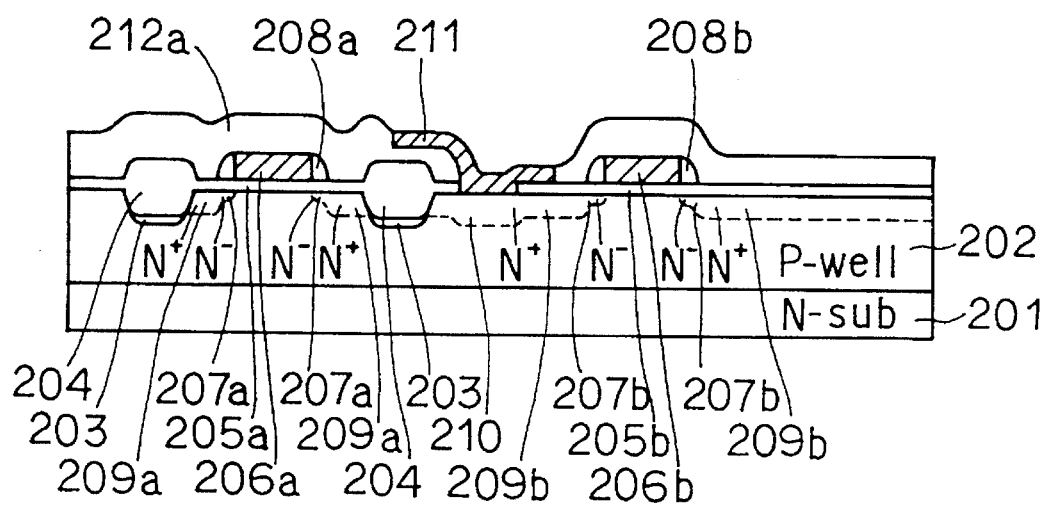

Referring to FIG. 21, an interlayer insulating film 212a is formed on the whole surface. One forms the contact electrode 211, which has a portion located in an opening of the interlayer insulating film 212a and is electrically connected to one of the N-type high concentration impurity regions 209b.

Figure 22:
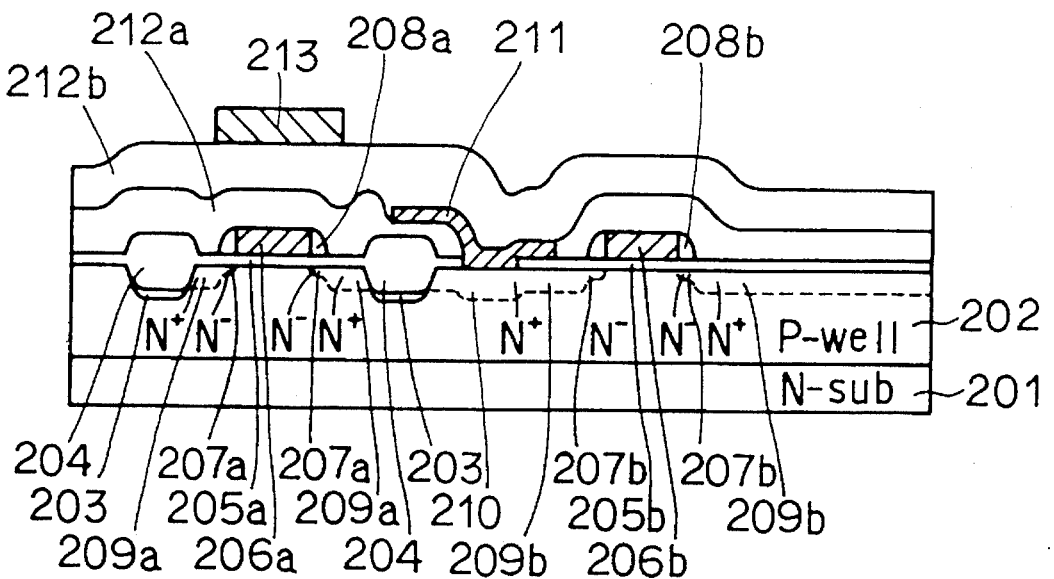

Then, as shown in FIG. 22, an interlayer insulating film 212b is formed on the whole surface. The gate electrode 213 of the TFT is formed at a region of the interlayer insulating film 212b located above the gate electrode 206a.

Figure 23:
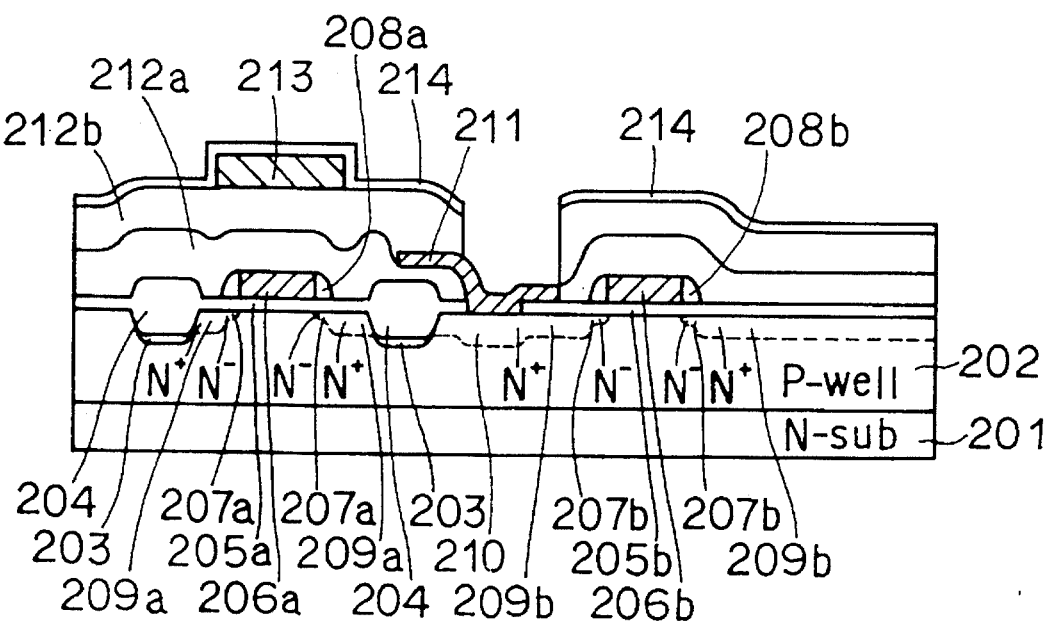

As shown in FIG. 23, the gate oxide film 214 of the TFT is formed on the whole surface. A contact opening is formed at portions of the interlayer insulating film 212b and gate oxide film 214 located above the contact electrode 211.

Figure 24:
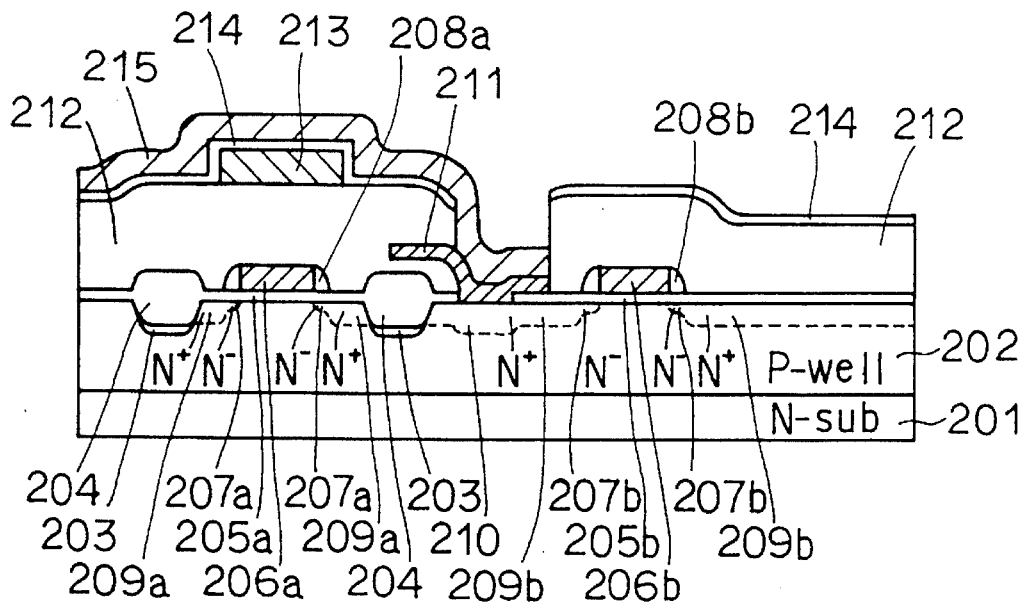
Figure 25:
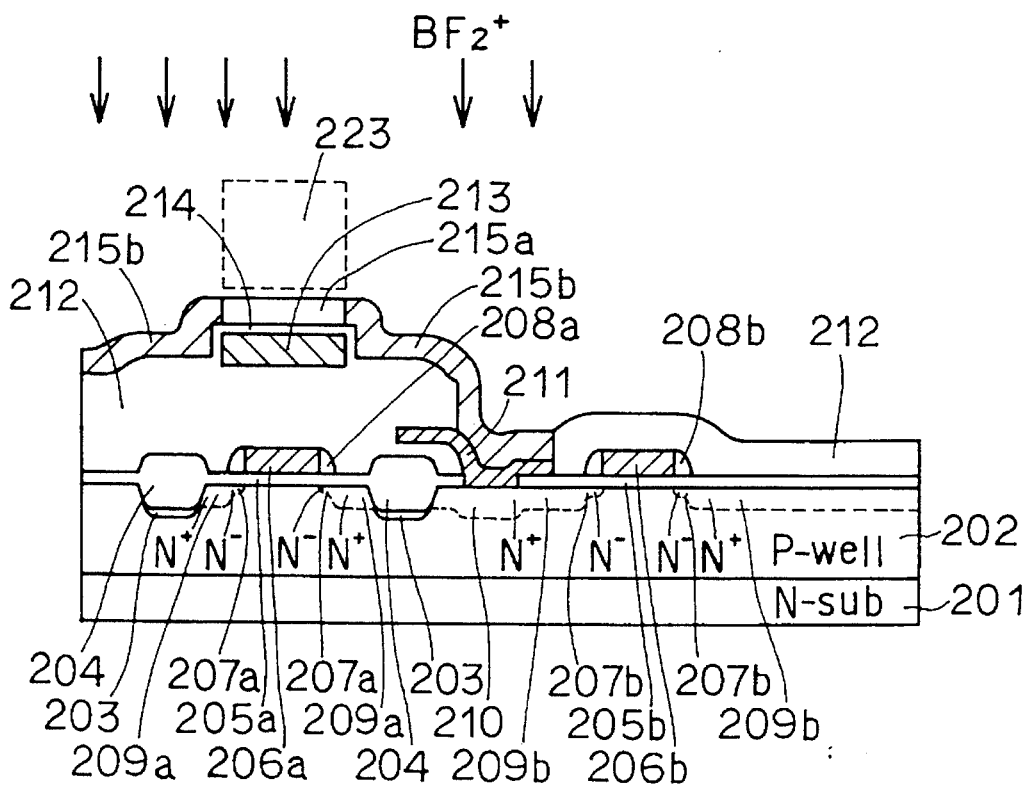

Then, as shown in FIG. 24, one forms the polysilicon film (including "amorphous silicon film") 215 which is electrically connected to the contact electrode 211 and has a portion extending over the gate electrode 213 with the gate oxide film 214 therebetween. N-type impurity is implanted at a low concentration into the polysilicon film 215 for adjusting a threshold voltage of the TFT. Thereafter, the gate oxide film 214 and interlayer insulating film 212 are etched back to a predetermined extent using the polysilicon film 215 as a mask. Thereby, the interlayer insulating film 212 shown in FIG. 25 is obtained. A resist 223 is formed on a channel region 215a of the polysilicon film 215. Using the resist 223 as a mask, P-type impurity ($BF_2^+$) is ion-implanted into the polysilicon film 215 to form the source/drain regions 215b of the TFT.

Figure 26:
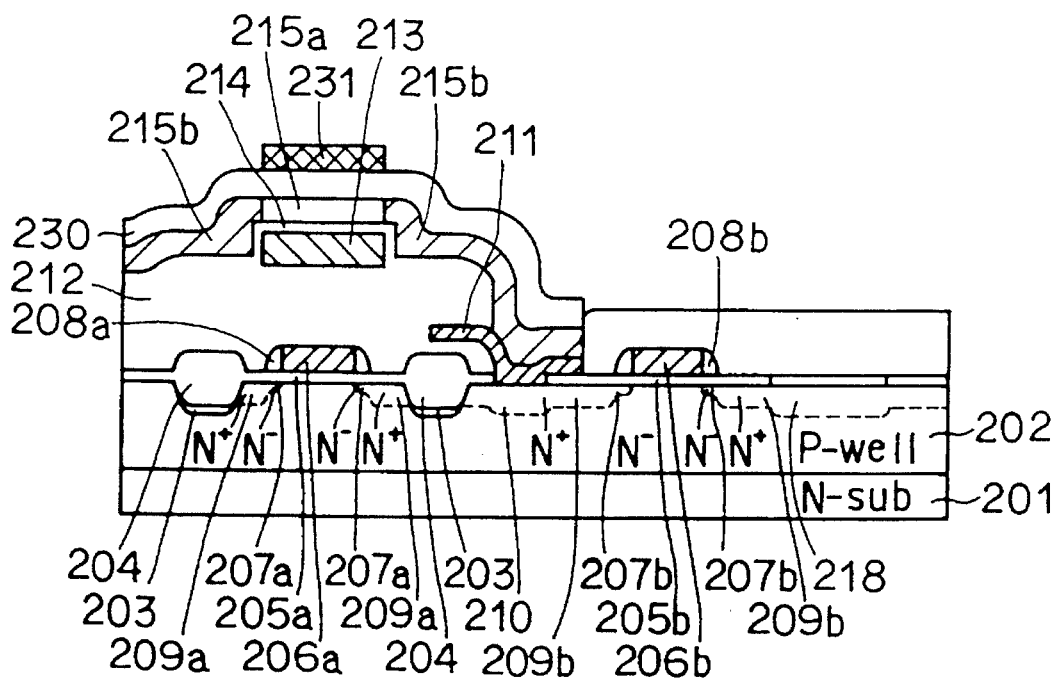

As shown in FIG. 26, an interlayer insulating film 230 is formed on the polysilicon film 215 (215a and 215b). A conductor layer 231 which is made of a polysilicon film containing N-type or P-type impurity doped thereinto is formed only on a region of the interlayer insulating film 230 located above the channel region 215a. The conductor layer 231 may be made of a film of amorphous silicon or metal of a high melting point.

Figure 27:
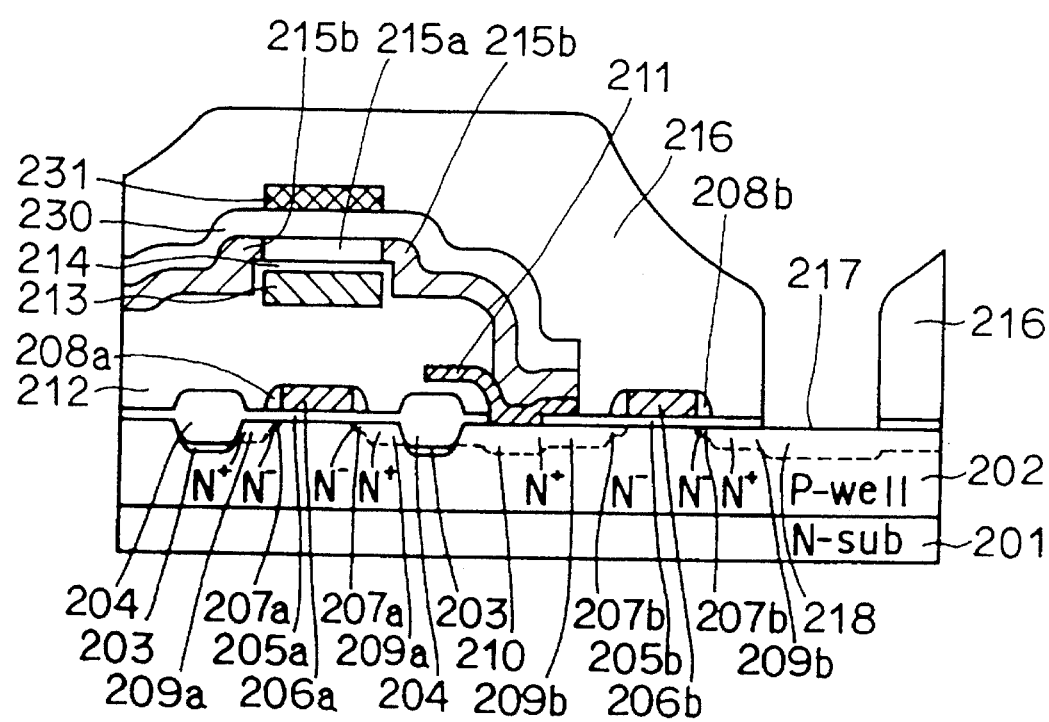

Referring to FIG. 27, the interlayer insulating film 216 is formed on the whole surface, and then the contact opening 217 is formed. N-type impurity is implanted into the semiconductor substrate 201 through the contact opening 217 to form the N-type impurity region 218.

Finally, as shown in FIG. 16, one forms the barrier metal layer 219, which has the portion located in the contact opening 217 and electrically connected to the N-type impurity region 217 and extends along the upper surface of the interlayer insulating film 216. The aluminum interconnection 220 forming the bit line is formed on the barrier metal layer 219. Further, the passivation film 221 is formed on the aluminum interconnection 220. In this manner, the semiconductor device having the TFT of the seventh embodiment shown in FIG. 16 is completed.

Figure 28:
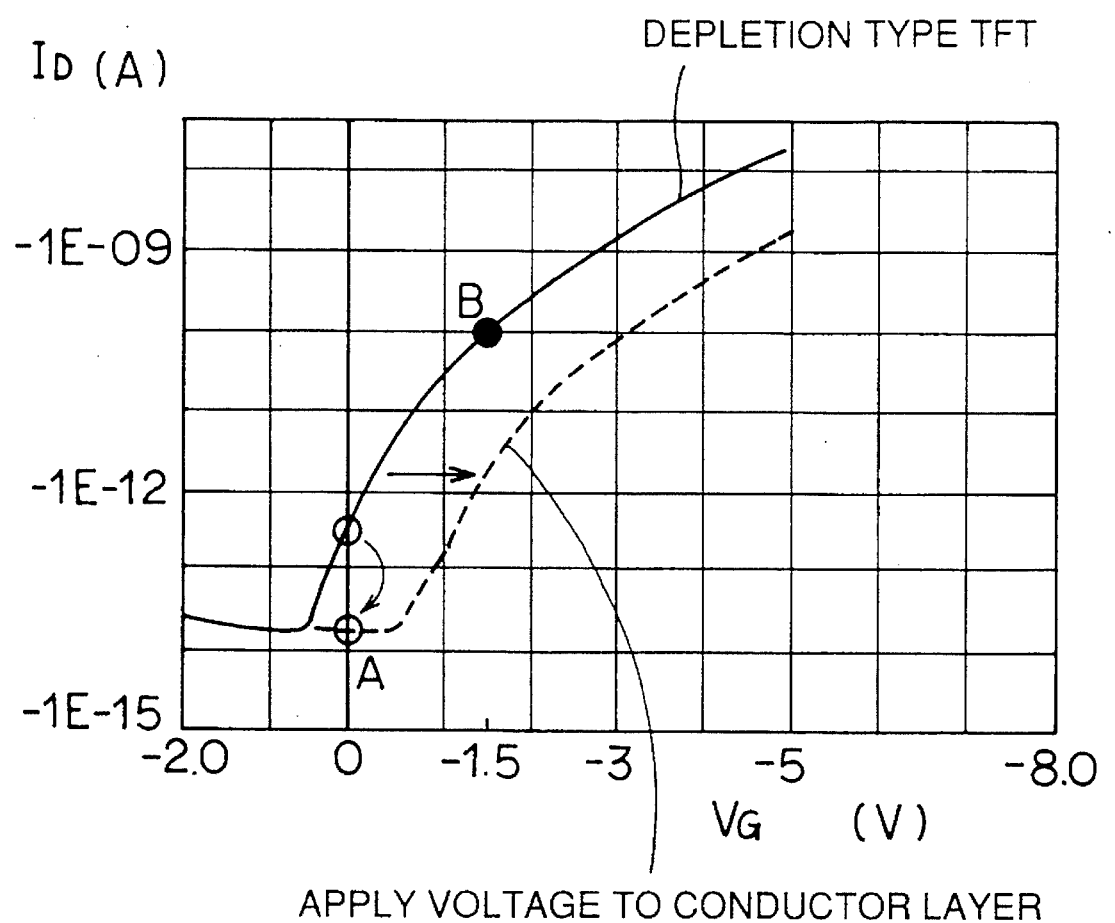
FIG. 28 is a graph showing a concept of a semiconductor device having a TFT according to an eighth embodiment of the invention and particularly showing V-I characteristic.

Referring to FIG. 28, solid line represents V-I characteristics of the TFT of a depletion type, and dotted line represents the V-I characteristics in the case where a voltage is applied to the conductor layer for increasing the threshold voltage only when the TFT is at the OFF state. In this eighth embodiment, one prepares the TFT of the depletion type as represented by the solid line. A potential not lower than the source potential of the TFT is applied to the conductor layer only if the transistor operation of the TFT is at the OFF state. Thereby, the OFF current of the TFT is equal to the current at the point A. Therefore, at this eighth embodiment, power consumption of the semiconductor device can be low. If the transistor operation of the TFT is at the ON state, the potential of the conductor layer is set to a value not higher than the source potential of the TFT and equal to that of a ground potential or a floating state.

The TFT of the depletion type described above is formed by ion-implanting fluorine (F) ions at the dose of $1\times10^{14}/cm^2$ into the polysilicon film forming the channel and source/drain regions of the TFT. Instead of the fluorine, ions of boron or the like may be implanted at the dose not less than $1\times10^{22}/cm^2$ to obtain the TFT of the depletion type.

Figure 29:
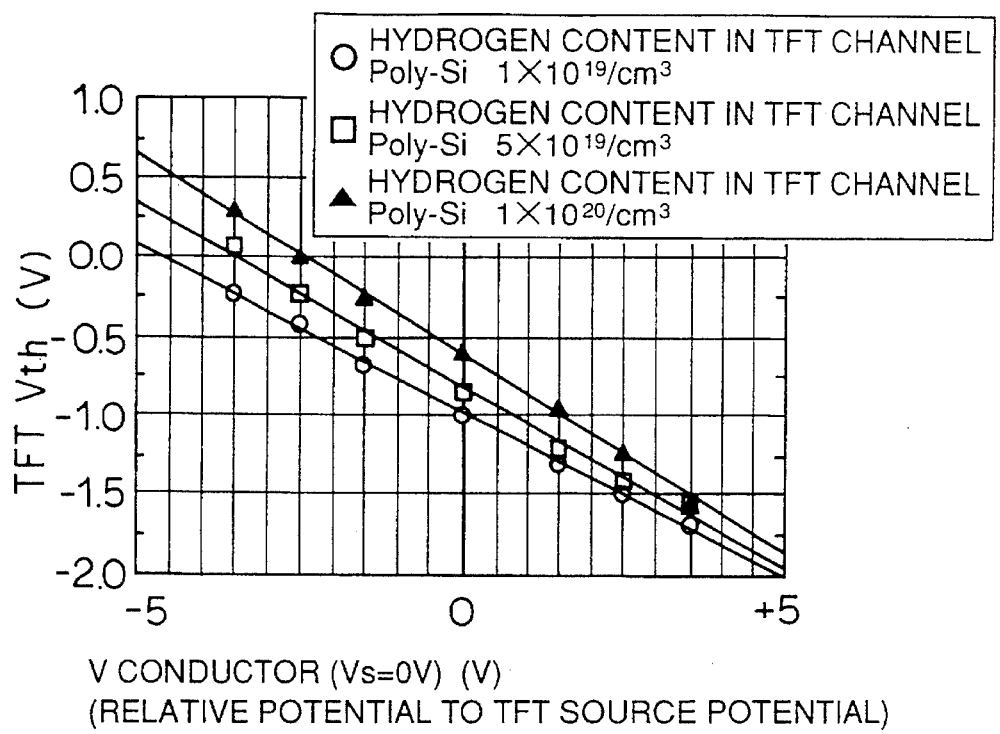
FIG. 29 is a graph showing a concept of a semiconductor device having a TFT according to a ninth embodiment of the invention, and particularly showing correlation between a threshold voltage and a voltage of a conductive layer.

Referring to FIG. 29, the voltage of the conductor layer is a relative value with respect to the source voltage of the TFT, and is represented as a voltage value relative to the source voltage $V_s$ of 0 V. This graph shows data measured under the conditions that the thickness of the gate oxide film is 250 Å and the thickness of the interlayer insulating film between the TFT channel polysilicon film and the conductor layer is about 2000 Å. The threshold voltage of the TFT with the voltage of the conductor layer being 0 V is the threshold voltage when the control is carried out only by the TFT gate electrode. Three lines in FIG. 29 represent the relationships at different contents of hydrogen in the TFT channel polysilicon layer. It can be seen that, as the hydrogen content increases, the threshold voltage $V_{th}$ of the TFT is affected by the conductor layer to a high extent. Taking this into consideration, the threshold voltage of the TFT is determined in accordance with the hydrogen content of the TFT channel polysilicon film and the potential of the conductor layer. Thereby, the threshold voltage of the TFT can be controlled more accurately.

Figure 30:
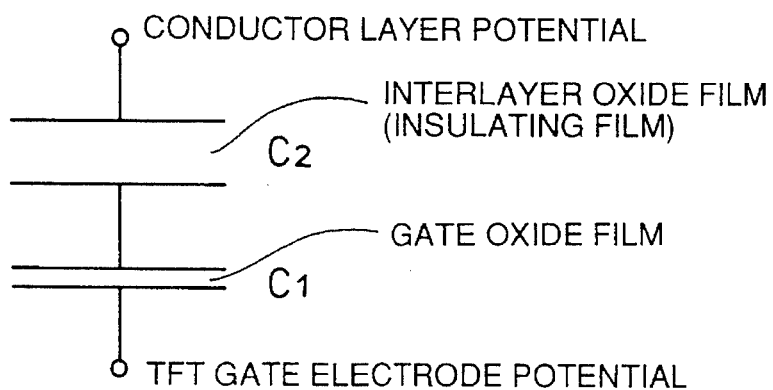
FIG. 30 is a schematic diagram showing a concept of a semiconductor device having a TFT according to a tenth embodiment of the invention.

A tenth embodiment of the invention will be described below. As shown in FIG. 29, the threshold voltage of the TFT is proportional to the voltage of the conductor layer. More specifically, the threshold voltage of the TFT and the voltage of the conductor layer, as shown in FIG. 30, are related to each other based on the capacitive coupling which is affected by the film thicknesses of the interlayer oxide film (insulating film) and gate oxide film. Utilizing this relationship, the threshold voltage of the TFT in this tenth embodiment is controlled by controlling the thickness of the interlayer oxide film (insulating film) between the conductor layer and the TFT channel polysilicon layer to be a predetermined value. Thus, variation of the threshold voltage of the TFT can be effectively prevented by controlling the potential applied to the conductor layer and the thickness of the interlayer oxide film (insulating film) between the conductor layer and the TFT channel polysilicon layer so that they may have predetermined values.

Figure 31:
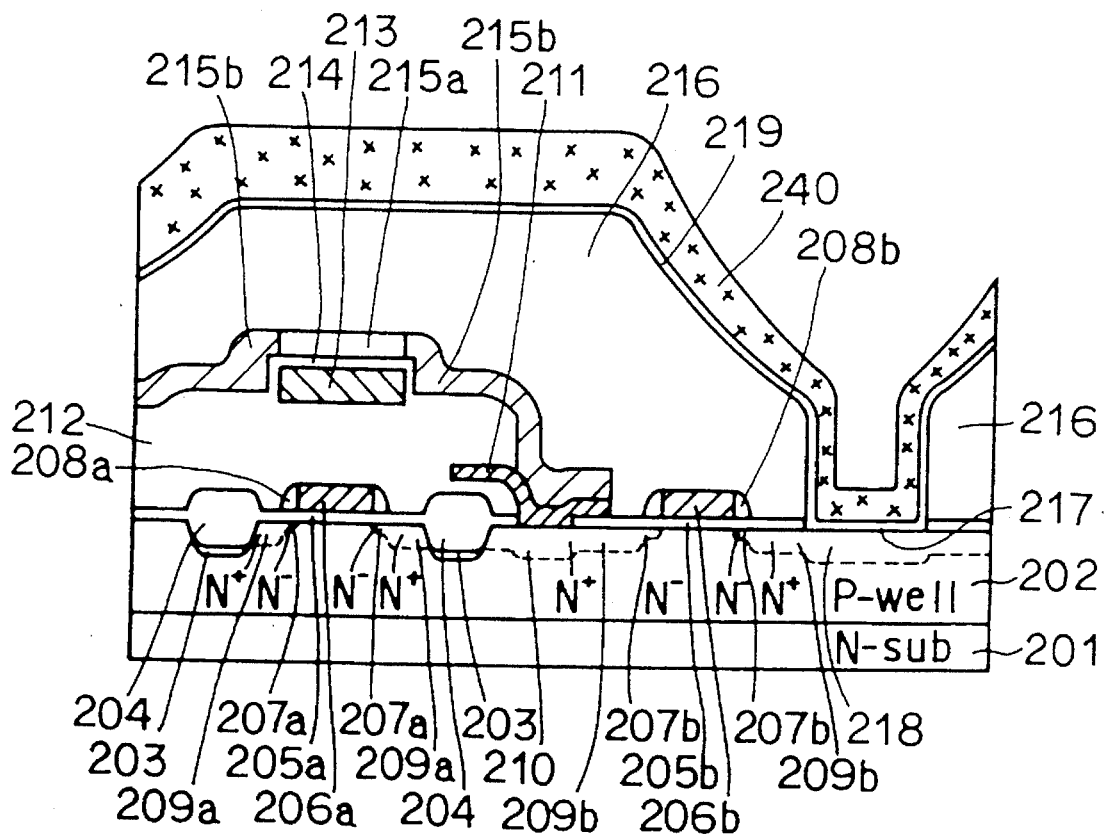
FIG. 31 is a cross section showing a semiconductor device (SRAM) having a TFT according to an eleventh embodiment of the invention.
Figure 32:
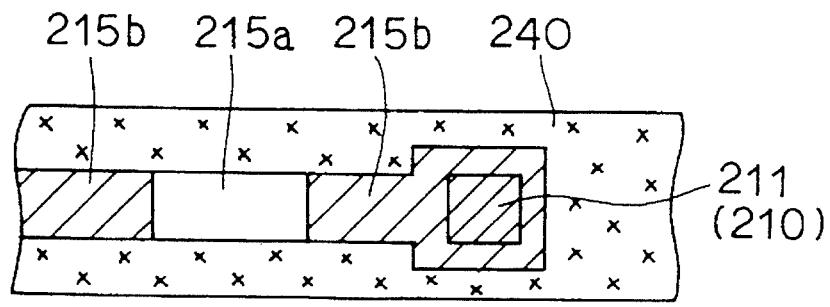
FIG. 32 is a fragmentary plan of the SRAM of the eleventh embodiment shown in FIG. 31.
Figure 33:
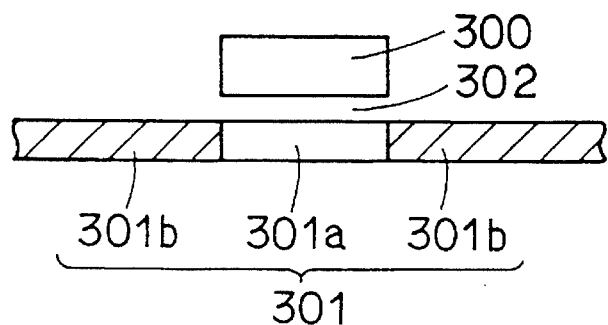
FIG. 33 is a cross section showing a structure of a conventional TFT.
Figure 34:
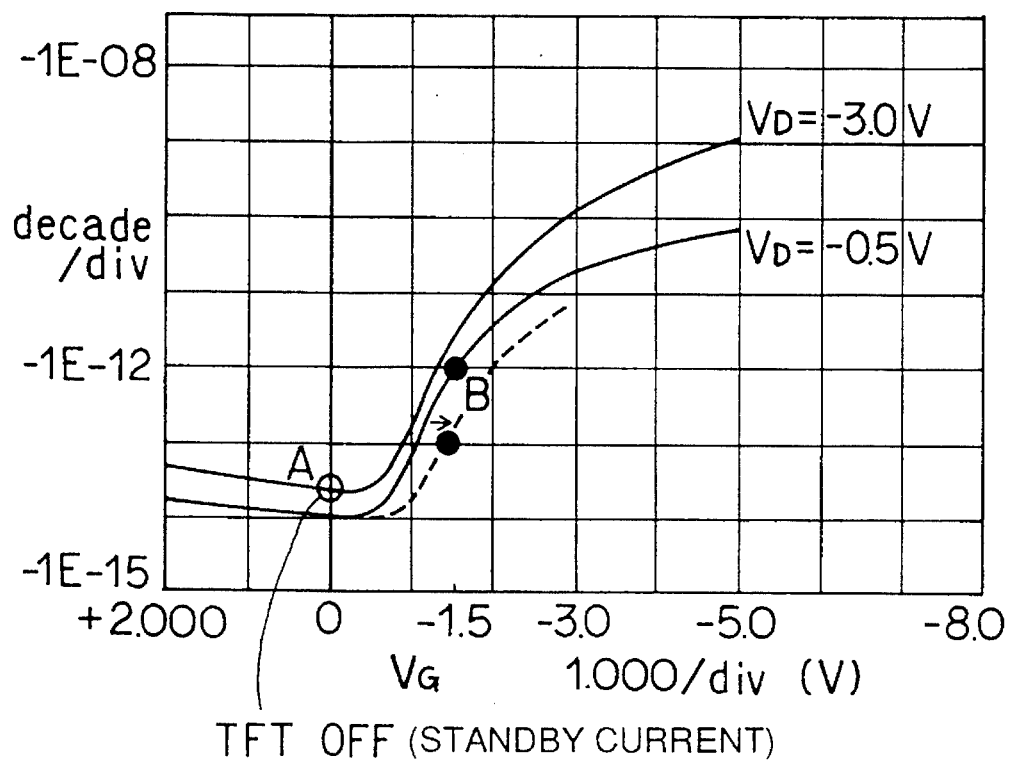
FIG. 34 is a graph showing I-V characteristics of a conventional P-type TFT.
Figure 35:
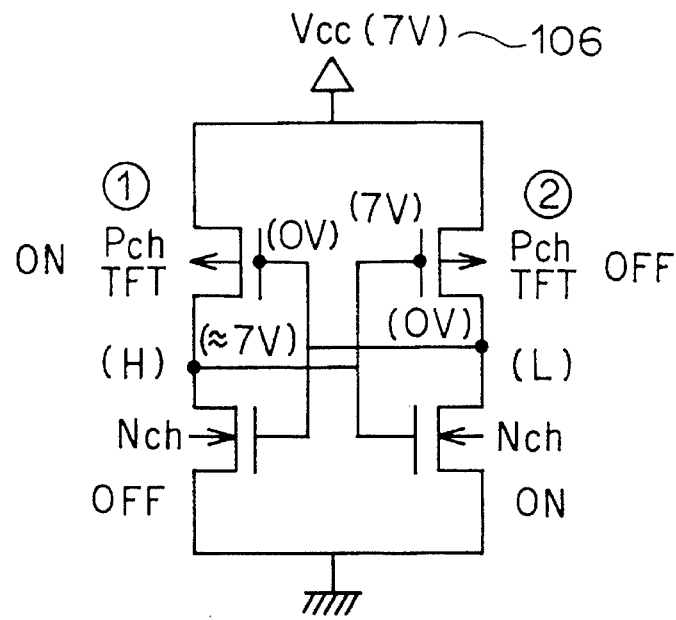
FIG. 35 is an equivalent circuit diagram of a conventional SRAM.

Referring to FIGS. 31 and 32, an eleventh embodiment is provided with a conductor layer which is formed of an aluminum interconnection 240 functioning as a bit line. Therefore, the bit line 240 is formed to cover the TFT channel polysilicon layer 215 (215a and 215b) as shown in FIG. 32. In this case, the potential of the bit line (aluminum interconnection) 240 is always intermediate the power supply potential $V_{cc}$ and ground potential. Thereby, this embodiment can achieve an effect similar to that of the second and third specific examples shown in FIGS. 4 and 5. Thus, this embodiment can effectively prevent upward variation of the threshold voltage of the TFT.

According to the semiconductor device of one aspect of the invention, the conductive layer is formed on the substantially same plane as the semiconductor layer, which forms the source/drain regions and the channel region of the thin film transistor, and is spaced therefrom by a predetermined distance. A predetermined potential is applied to the conductive layer. Thereby, it is possible to suppress effectively upward or downward variation of the threshold voltage of the thin film transistor. The conductive layer may be formed at opposite sides of the semiconductor layer so that the semiconductor layer may be located between portions of the conductive layer, which promotes application of the electric field from the conductive layer to the channel region of the semiconductor layer, so that variation of the threshold voltage can be suppressed more effectively.

According to the semiconductor device of another aspect of the invention, the conductive layer is opposed only to the channel region of the semiconductor layer, and a predetermined potential is applied to the conductive layer, so that an electric field can be applied from the conductive layer to the channel region. Consequently, variation of the threshold voltage of the TFT can be effectively prevented.

According to the semiconductor device of still another aspect of the invention, the conductive layer is formed on the other surface of the semiconductor layer, which forms the channel region and source/drain regions of the thin film transistor, with the insulating film therebetween, and overlaps partially with the semiconductor layer. A predetermined potential is applied to the conductive layer. Thereby, it is possible to prevent effectively upward or downward variation of the threshold voltage of the TFT.

According to the semiconductor device of yet another aspect of the invention, there is provided the switching circuit which performs switching in accordance with the output signal coming from the inverting circuit for inverting the signal on the input line. The second power supply is connected to one of the terminals of the switching circuit, the other of which is connected to the circuit provided for preventing variation of the threshold voltage of the thin film transistor, so that the circuit for preventing variation of the threshold voltage applies the electric field in accordance with the signal on the input line. Thereby, it is possible to suppress effectively upward or downward variation of the threshold voltage of the thin film transistor.

According to the semiconductor device of still another aspect of the invention, there is provided the switching transistor which performs switching in accordance with the signal on the input line. The second power supply is connected to one of the terminals of the switching transistor, the other of which is connected to the circuit provided for preventing variation of the threshold voltage, so that the circuit for preventing variation of the threshold voltage of the thin film transistor applies the electric field in accordance with the signal on the input line. Thereby, it is possible to prevent effectively upward or downward variation of the threshold voltage of the thin film transistor.

According to the semiconductor device of still another aspect of the invention, there is provided the circuit for preventing variation of the threshold voltage of the thin film transistor, and a potential which is in a range between the potential of the power supply and the ground potential is applied to the circuit for preventing variation of the threshold voltage. Thereby, it is possible to suppress effectively upward variation of the threshold voltage of the thin film transistor.

According to the method of manufacturing the semiconductor device of the invention, the conductive layer to which a predetermined potential is applied is formed so that it is opposed only to the channel region of the semiconductor layer, whereby the semiconductor device capable of effectively preventing variation of the threshold voltage of the thin film transistor can be easily manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a thin film transistor, comprising:

a semiconductor layer forming source/drain regions and a channel region of said thin film transistor;

a conductive layer which is formed substantially on the same plane as said semiconductor layer with a predetermined space therebetween, a predetermined potential being applied to said conductive layer to prevent threshold voltage variations of said thin film transistor; and a gate electrode formed on a surface of said semiconductor layer with a gate insulating layer therebetween, said gate electrode being electrically separated from said conductive layer.

2. The semiconductor device according to claim 1, wherein said conductive layer is formed at opposite sides of said semiconductor layer so that said semiconductor layer is located between portions of said conductive layer.

3. The semiconductor device according to claim 1, wherein said gate electrode is located under said semiconductor layer and is formed substantially perpendicularly to a direction of extension of said semiconductor layer.

4. The semiconductor device according to claim 1, wherein a threshold voltage of said thin film transistor is controlled by setting a potential applied to said conductive layer and a content of hydrogen of said semiconductor layer to predetermined values.

5. A semiconductor device having a thin film transistor, comprising:

a semiconductor layer forming source/drain regions and a channel region of said thin film transistor;

a gate electrode formed on one of surfaces of said semiconductor layer with a gate insulating layer therebetween; and a conductive layer which is formed on the other surface of said semiconductor layer with an insulating layer therebetween and is opposed only to said channel region, said gate electrode being electrically separated from said conductive layer, a predetermined potential being applied to said conductive layer to prevent threshold voltage variations of said thin film transistor.

6. The semiconductor device according to claim 5, wherein said semiconductor layer is formed on upper and side surfaces of said gate electrode with said gate insulating layer therebetween.

7. The semiconductor device according to claim 5, wherein a threshold voltage of said thin film transistor is controlled by setting a potential applied to said conductive layer and a thickness of said insulating layer to predetermined values.

8. A semiconductor device having a thin film transistor, comprising:

a semiconductor layer forming source/drain regions and a channel region of said thin film transistor;

a gate electrode formed on one of surfaces of said semiconductor layer with a gate insulating layer therebetween; and a conductive layer which is formed on the other surface of said semiconductor layer with an insulating layer therebetween and overlaps partially with said semiconductor layer, said gate electrode being electrically separated from said conductive layer, a predetermined potential being applied to said conductive layer to prevent threshold voltage variations of said thin film transistor.

9. The semiconductor device according to claim 8, wherein said gate electrode is formed substantially perpendicularly to a direction of extension of said conductive layer and is located under said conductive layer.

10. A semiconductor device comprising:

an input line;

a thin film transistor coupled between said input line and first power supply means, and having a gate electrode;

inverting means connected to said input line for inverting a signal on said input line;

switching means coupled to said inverting means for performing switching in accordance with an output signal sent from said inverting means;

second power supply means connected to one terminal of said switching means; and means connected to another terminal of said switching means for applying a predetermined potential to said thin film transistor to prevent variation of a threshold voltage of said thin film transistor, said means for applying a predetermined potential having a conductive layer adjacent said thin film transistor and electrically separated from said gate electrode.

11. The semiconductor device according to claim 10, wherein a potential of said second power supply means is higher than a potential of said first power supply means.

12. The semiconductor device according to claim 10, wherein said conductive layer applies said predetermined potential through a predetermined space provided between said conductive layer and a semiconductor layer of said thin film transistor.

13. A semiconductor device comprising:

an input line;

a thin film transistor of a first conductivity type coupled between said input line and first power supply means, and having a gate electrode;

a switching transistor of a second conductivity type for performing switching in accordance with a signal on said input line;

second power supply means connected to one terminal of said switching transistor; and means connected to another terminal of said switching transistor for applying a predetermined potential to said thin film transistor to prevent variation of a threshold voltage of said thin film transistor, said means for applying a predetermined potential having a conductive layer adjacent said thin film transistor and electrically separated from said gate electrode.

14. The semiconductor device according to claim 13, wherein said conductive layer applies said predetermined potential through a predetermined space provided between said conductive layer and a semiconductor layer of said thin film transistor.

15. A semiconductor device comprising:

a thin film transistor connected to power supply means, and having a gate electrode; and means for applying a predetermined potential to said power supply means to prevent variation of a threshold voltage of said thin film transistor, said means for applying a predetermined potential having a conductive layer adjacent said thin film transistor and electrically separated from said gate electrode, wherein said predetermined potential is set within a range between a potential of said power supply means and a ground potential.

16. The semiconductor device according to claim 15, wherein said means for preventing variation of the threshold voltage is connected to second power supply means through an N-type transistor.

17. The semiconductor device according to claim 15, wherein said means for preventing variation of the threshold voltage is connected to second power supply means through a diode.

18. The semiconductor device according to claim 15, wherein said conductive layer applies said predetermined potential through a predetermined space provided between said conductive layer and a semiconductor layer of said thin film transistor.

19. A semiconductor device comprising:

a thin film transistor of a depletion type having a gate electrode; and a conductive layer provided near a channel region of said thin film transistor, said gate electrode being electrically separated from said conductive layer, a potential higher than a source potential of said thin film transistor being applied to said conductive layer only when said thin film transistor is at an OFF state to prevent variations of a threshold voltage of said thin film transistor.

* * * * *